(12) United States Patent
Kashiyama et al.

(10) Patent No.: US 11,358,076 B2
(45) Date of Patent: Jun. 14, 2022

(54) FILTER COUPLING DEVICE AND SUBSTRATE TREATING APPARATUS PROVIDED THEREWITH

(71) Applicant: SCREEN Holdings Co., Ltd., Kyoto (JP)

(72) Inventors: Masahito Kashiyama, Kyoto (JP); Toshiya Kuwahara, Kyoto (JP)

(73) Assignee: SCREEN Holdings Co., Ltd.

( * ) Notice: Subject to any disclaimer, the term of this patent is extended or adjusted under 35 U.S.C. 154(b) by 719 days.

(21) Appl. No.: 15/905,990

(22) Filed: Feb. 27, 2018

(65) Prior Publication Data

US 2018/0272257 A1 Sep. 27, 2018

(30) Foreign Application Priority Data

Mar. 21, 2017 (JP) .............................. JP2017-054420

(51) Int. Cl.
| | | |
|---|---|---|
| *B01D 29/96* | (2006.01) | |
| *B01D 35/30* | (2006.01) | |
| *H01L 21/687* | (2006.01) | |
| *H01L 21/67* | (2006.01) | |
| *B01D 35/02* | (2006.01) | |

(52) U.S. Cl.
CPC ............. *B01D 29/96* (2013.01); *B01D 35/02* (2013.01); *B01D 35/30* (2013.01); *B01D 35/306* (2013.01); *H01L 21/67023* (2013.01); *H01L 21/68764* (2013.01); *B01D 2201/303* (2013.01); *B01D 2201/4007* (2013.01); *B01D 2201/4023* (2013.01); *B01D 2201/4046* (2013.01); *B01D 2201/4076* (2013.01)

(58) Field of Classification Search
None
See application file for complete search history.

(56) References Cited

U.S. PATENT DOCUMENTS

| | | | |
|---|---|---|---|
| 6,068,777 A | 5/2000 | Kimura et al. | 210/747 |
| 2003/0217958 A1* | 11/2003 | Reid | B01D 35/301 210/232 |

(Continued)

FOREIGN PATENT DOCUMENTS

| | | |
|---|---|---|
| CN | 1646202 A | 7/2005 |
| JP | H10-071326 A | 3/1998 |

(Continued)

OTHER PUBLICATIONS

"Machine Translation of KR20150055866", Park et al., published 2015, 22 total pages (Year: 2015).*

(Continued)

*Primary Examiner* — Jonathan M Peo
(74) *Attorney, Agent, or Firm* — Ostrolenk Faber LLP

(57) ABSTRACT

Disclosed is a filter coupling device having joint members, a base plate, a filter holder, a rotation shaft, and a leg. The filter holder allows support of a first filter and a second filter. The rotation shaft is connected with the filter holder. The filter holder takes a first attitude and a second attitude by rotating around the rotation shaft. The filter holder includes a first filter holder configured to support the first filter in the first attitude, and a second filter holder configured to support the second filter in the second attitude.

15 Claims, 21 Drawing Sheets

(56) References Cited

U.S. PATENT DOCUMENTS

| | | | |
|---|---|---|---|
| 2009/0236272 A1* | 9/2009 | Zerger | C02F 9/005 |
| | | | 210/137 |
| 2015/0113925 A1 | 4/2015 | Gatica et al. | |
| 2015/0114896 A1* | 4/2015 | Lam | B01D 35/30 |
| | | | 210/236 |
| 2015/0375273 A1* | 12/2015 | Ishii | B01D 19/0031 |
| | | | 134/110 |

FOREIGN PATENT DOCUMENTS

| | | |
|---|---|---|
| JP | 2003-251110 A | 9/2003 |
| JP | 2010-144777 A | 7/2010 |
| JP | 2014-195807 A | 10/2014 |
| JP | 2015-085327 A | 5/2015 |
| KR | 10-2012-0038299 A | 4/2012 |
| KR | 10-2013-0138386 | 12/2013 |
| KR | 10-2015-0055866 | 5/2015 |
| WO | WO 03/072220 A1 | 9/2003 |

OTHER PUBLICATIONS

Notice of Allowance dated Mar. 28, 2019 for Korean Patent Application No. 10-2018-0031483.
Office Action dated Nov. 4, 2020 for Japanese Patent Application No. 2017-054420.
Office Action dated Jul. 19, 2021 for Chinese Patent Application No. 201810233405.8.

\* cited by examiner

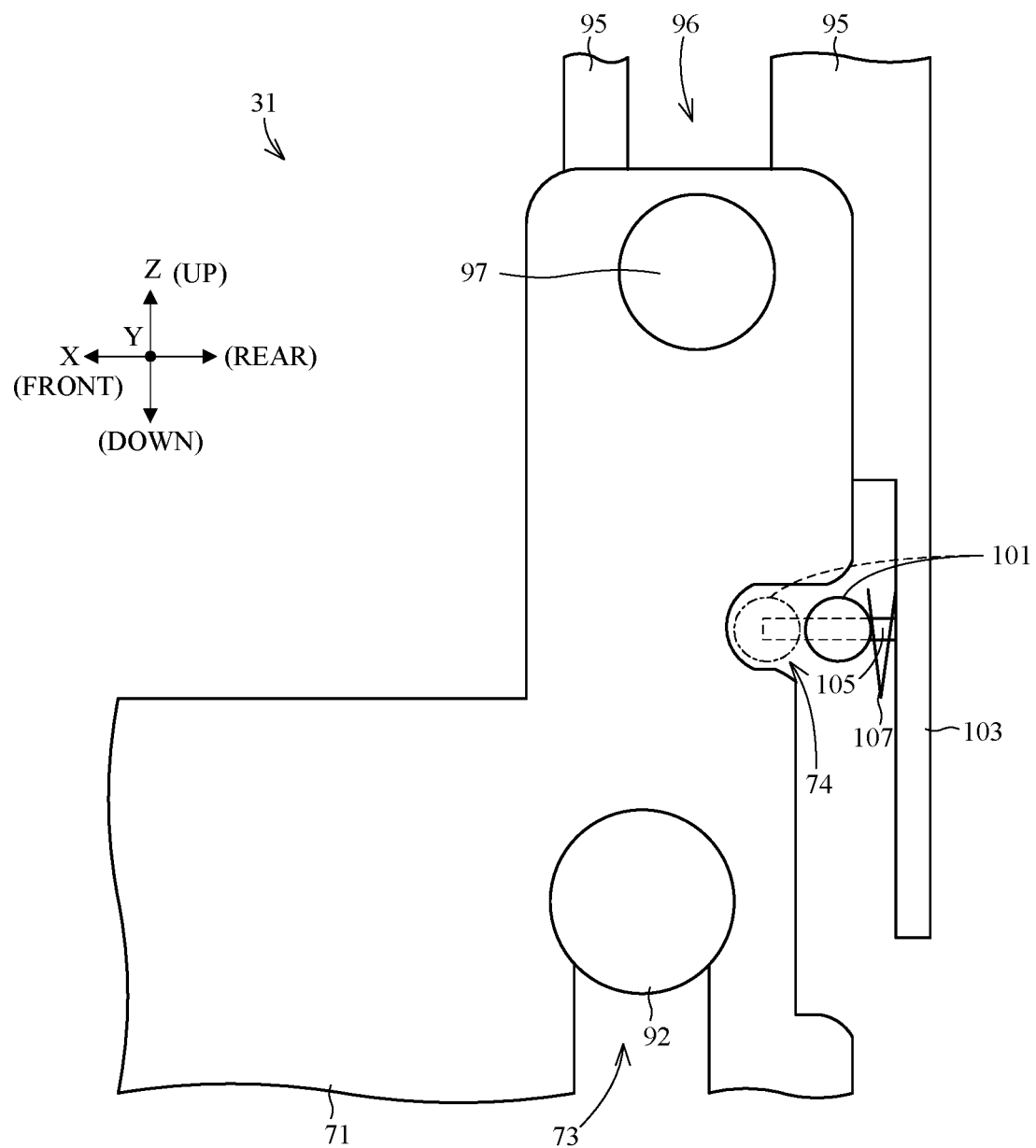

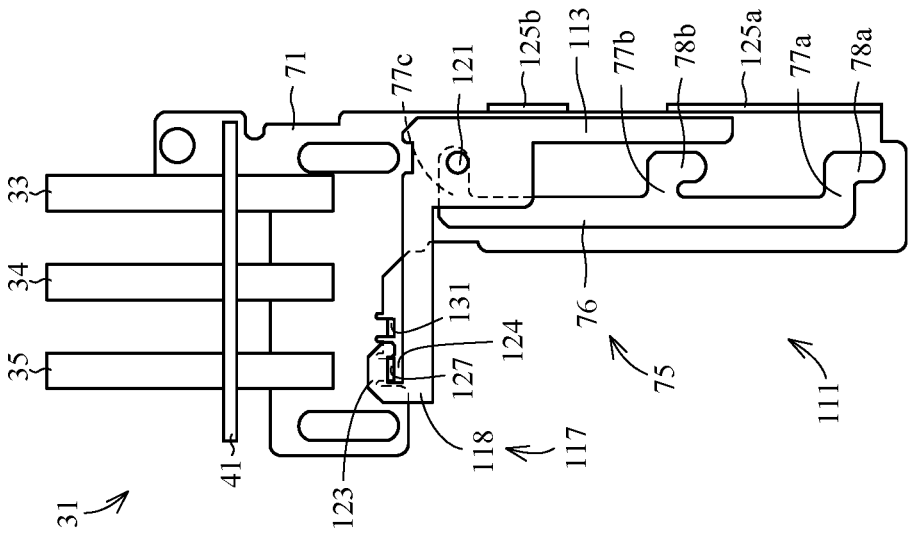
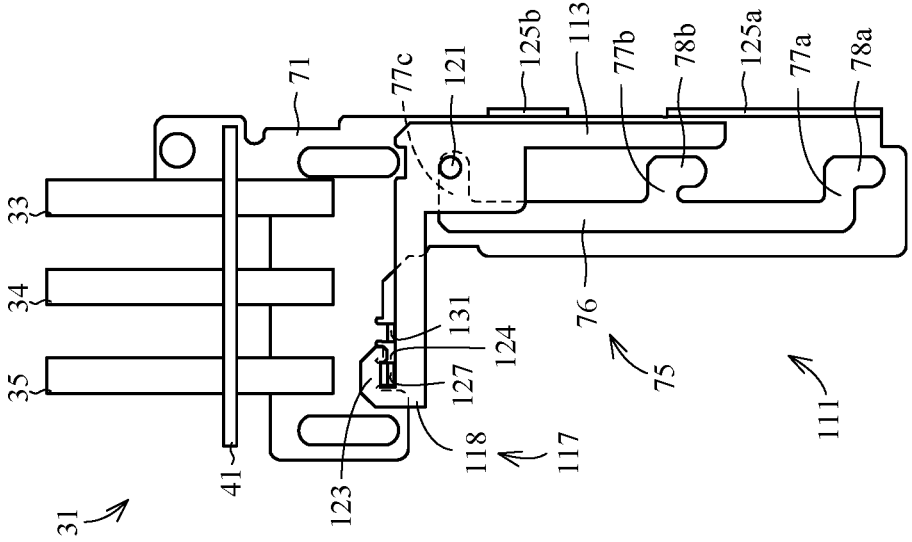
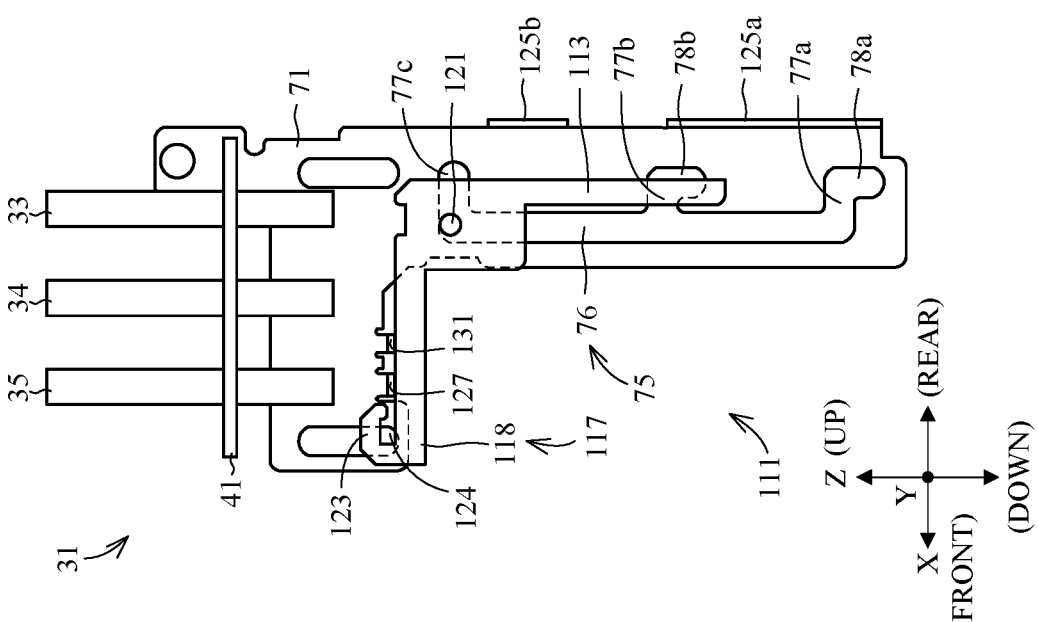

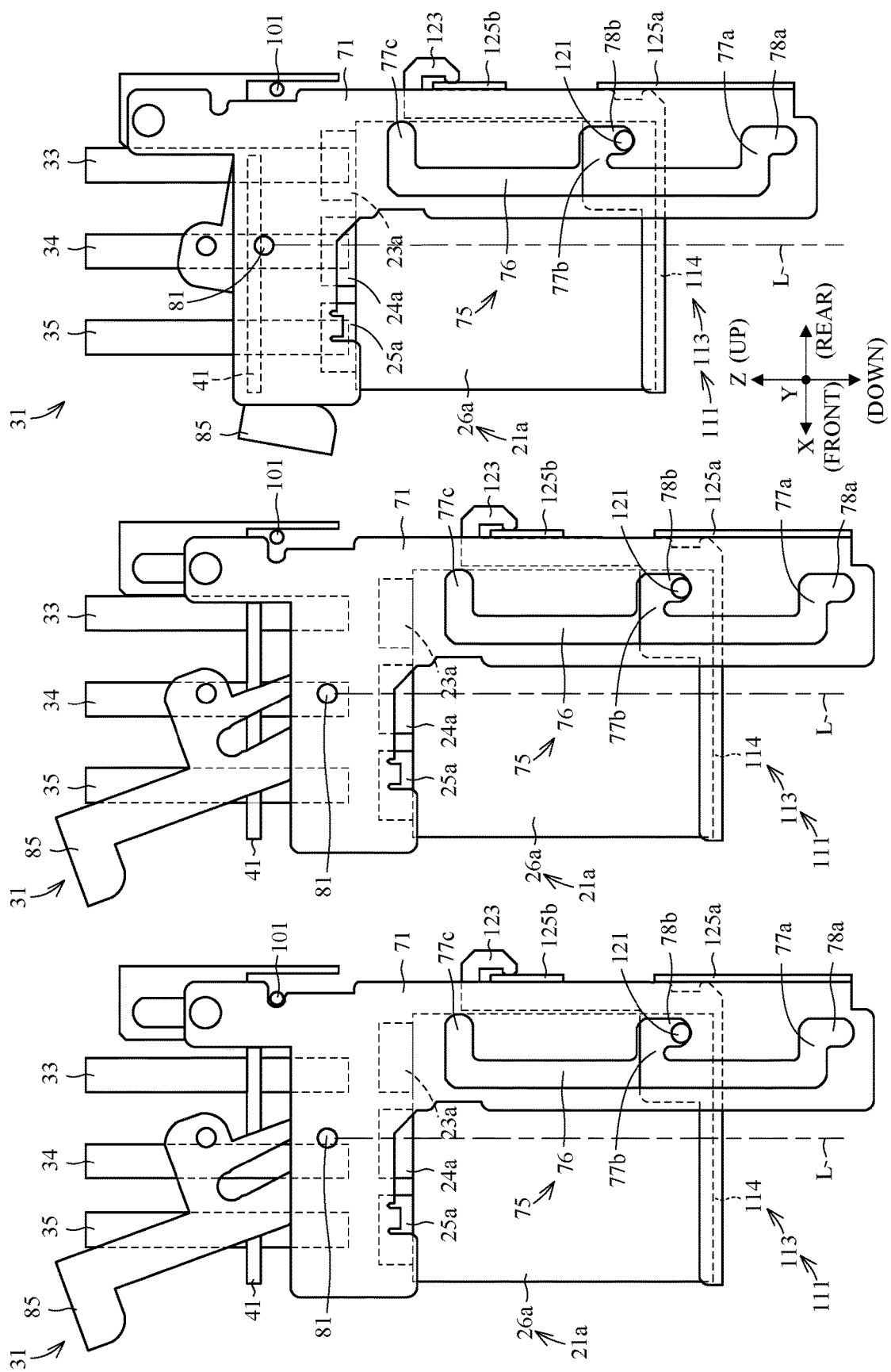

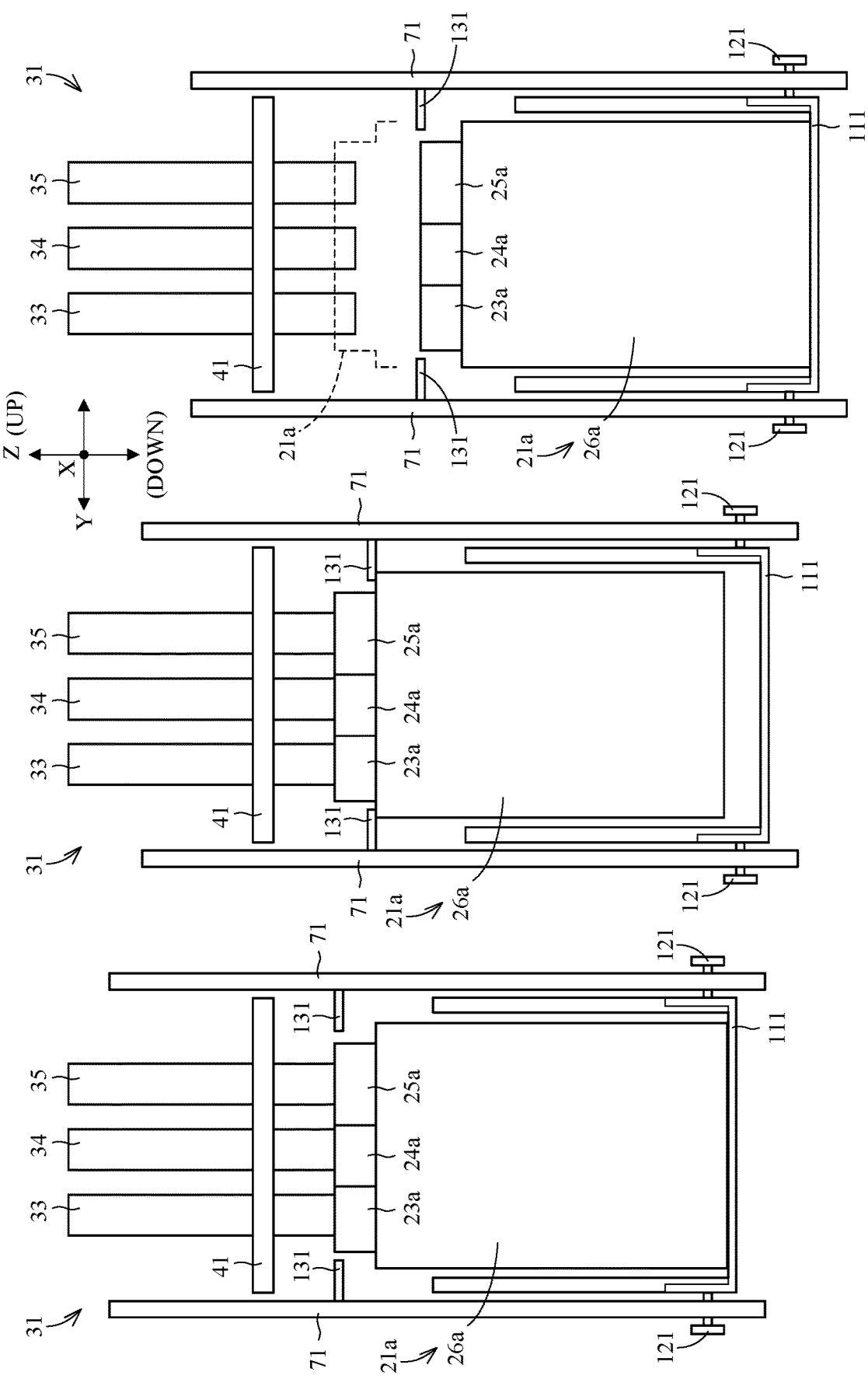

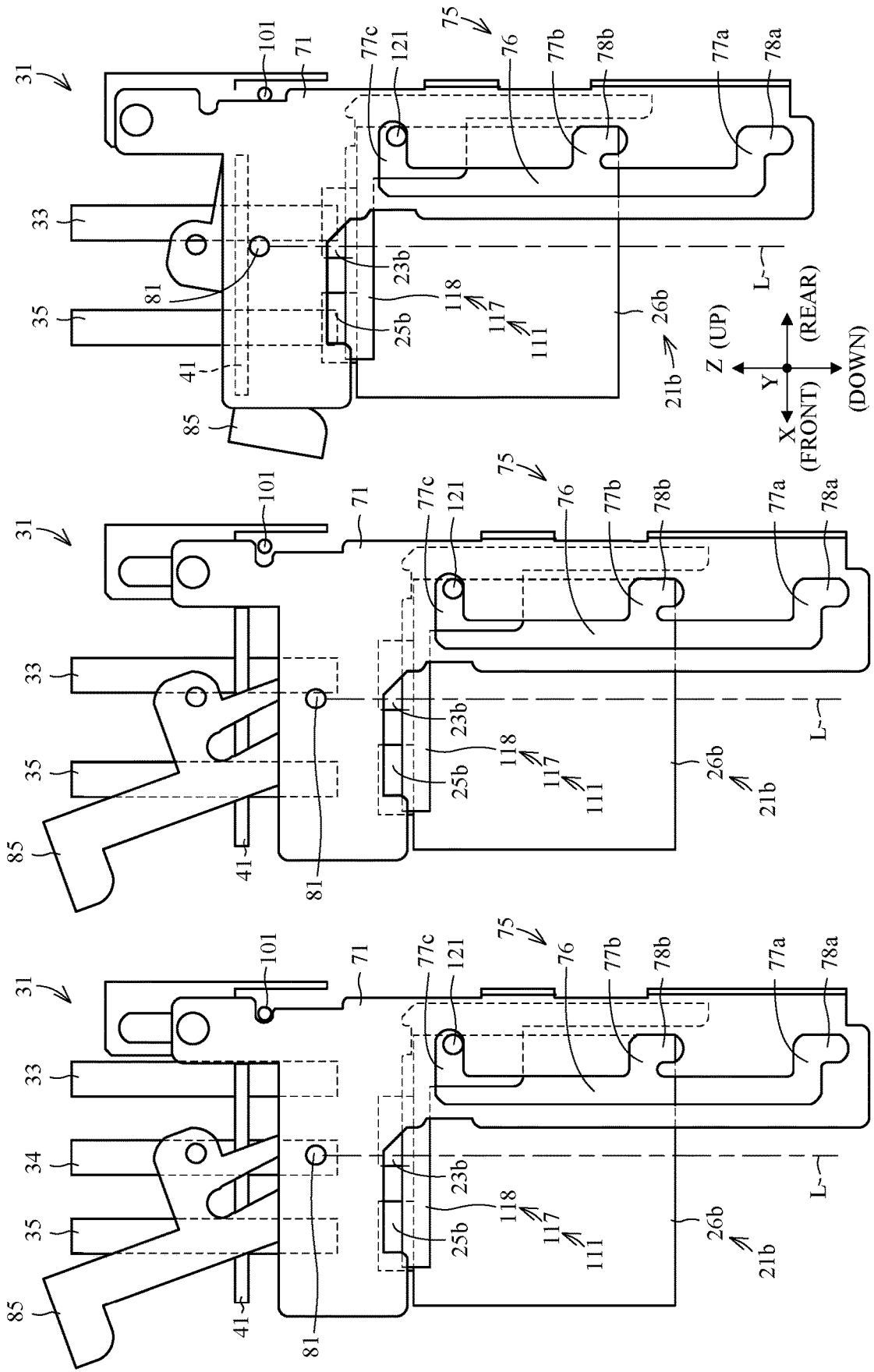

FILTER COUPLING DEVICE AND SUBSTRATE TREATING APPARATUS PROVIDED THEREWITH

CROSS-REFERENCE TO RELATED APPLICATIONS

This application claims priority to Japanese Patent Application No. 2017-054420 filed Mar. 21, 2017, the disclosure of which is hereby incorporated herein by reference in its entirety for all purposes.

BACKGROUND OF THE INVENTION

Field of the Invention

The present invention relates to a filter coupling device for connection with a filter, and a substrate treating apparatus having the filter coupling device. Examples of substrates treated by the substrate treating apparatus include semiconductor wafers, glass substrates for photomasks, glass substrates for liquid crystal displays, substrate for plasma display, substrates for organic EL, substrates for field emission display (FED), substrates for optical display, magnetic disk substrates, optical disk substrates, optical magnetic disk substrates, and solar cell substrates, and so on.

Background Art

A filter filters a treating liquid. The filter is mounted on a supply line for supplying the treating liquid to substrates. The filter has a filter body, and a plurality of connection openings. One of the connection openings is, for example, as an inlet for inflow of the treating liquid into the filter body. Another connection opening is, for example, an outlet for outflow of the treating liquid from the filter body.

A filter coupling device is used to insert the filter into the supply line with ease. The filter coupling device includes a plurality of connection ports for connection with the connection openings. The connection ports are located in the same arrangement as the connection openings. When the filter is coupled to the filter coupling device, the connection openings are connected all together with the connection ports to bring the filter into connection with the supply line in a communicated manner. Such is disclosed, for example, in Japanese Unexamined Patent Publication No. 2003-251110A, 2015-85327A, and No. 2014-195807A.

SUMMARY OF THE INVENTION

However, the example of the currently-used apparatus with the above configuration has the following problems. The currently-used filter coupling device causes an inconvenience that replacement cannot be made easily between two or more types of filters with different shapes.

The currently-used filter coupling device has difficulty in holding the two types of filters with different shapes individually in an appropriate manner. Consequently, the filter coupling device has to be replaced by a suitable filter coupling device selected in accordance with the shape of the filter. For instance, when a first filter coupled to the filter coupling device is replaced by a second filter having the different shape from the first filter, the filter coupling device itself is also replaced by another filter coupling device. As noted above, the currently-used filter coupling device causes the difficulty in easy replacement among two or more types of filters having different shapes.

The currently-used filter coupling device, therefore, causes an inconvenience that replacement cannot be made easily among two or more types of filters with different arrangements of the connection openings.

The currently-used filter coupling device is able to be coupled only to a filter whose connection openings are arranged in a specific layout. The layout of the connection openings of the filter varies with the filter coupling device adapted for the filter. Consequently, selection of an appropriate filter coupling device in accordance with the layout of the connection openings is required for replacement of the filter coupling device.

For instance, the first filter includes a plurality of connection openings. The second filter also includes a plurality of connection openings. The connection openings of the first filter differ from the connection openings of the second filter in arrangement. When the first filter coupled to the filter coupling device is replaced by the second filter, the filter coupling device itself is also replaced by another filter coupling device. Consequently, with the currently-used filter coupling device, it is not easy to perform replacement among two or more types of filters with different arrangements of the connection openings.

The present invention has been made regarding the state of the art noted above, and its primary object is to provide a filter coupling device that is able to be coupled to two or more types of filters with different shapes suitably, and a substrate treating apparatus provided with such a filer coupling device. In addition, a secondary object of the present invention is to provide a filter coupling device that is able to be coupled to two or more types of filters with different arrangements of connection openings suitably, and a substrate treating apparatus provided with such a filter coupling device.

The present invention is constituted as stated below to achieve the above object. One aspect of the present invention provides a filter coupling device allows coupling to both a first filter and a second filter with different shapes from each other. The filter coupling device includes connection ports that allow connection with a connection opening of the first filter and a connection opening of the second filter, a base configured to support the connection ports, a filter holder that allows support of the first filter and the second filter, a rotation shaft connected with the filter holder, and a leg configured to retain the rotation shaft. The filter holder takes a first attitude and a second attitude by rotating around the rotation shaft. The filter holder includes a first filter holder configured to support the first filter in the first attitude, and a second filter holder configured to support the second filter in the second attitude.

The filter coupling device includes the filter holder, the rotation shaft, and the leg. This suitably rotates the filter holder. In addition, the filter holder is able to take the first attitude and the second attitude.

The filter holder includes the first filter holder, and the second filter holder. When the filter holder is in the first attitude, the first filter holder supports the first filter. Accordingly, the filter holder allows suitable support of the first filter. When the filter holder is in the second attitude, the second filter holder supports the second filter. Accordingly, the filter holder allows suitable support of the second filter. It should be noted that the second filter differs from the first filter in shape.

Consequently, the filter coupling device is able to be coupled to two or more types of filters suitably having different shapes individually. This facilitates replacement among two or more types of filters having different shapes.

In the example of the present invention described above, it is preferred that, when the filter holder is in the first attitude, the first filter holder contacts a housing of the first filter and the second filter holder is positioned away from the first filter. It is also preferred that, when the filter holder is in the second attitude, the second filter holder contacts a housing of the second filter and the first filter holder is positioned away from the second filter.

When the filter holder is in the first attitude, the first filter holder contacts the housing of the first filter. This allows the first filter holder to support the first filter suitably. When the filter holder is in the first attitude, the second filter holder does not contact the first filter. Accordingly, this allows the first filter holder to support the first filter more suitably.

Likewise, when the filter holder is in the second attitude, the second filter holder contacts the housing of the second filter. This allows the second filter holder to support the second filter suitably. When the filter holder is in the second attitude, the first filter holder does not contact the second filter. Accordingly, this allows the second filter holder to support the second filter more suitably.

In the example of the present invention described above, it is preferred that the first filter holder includes a floor with a placement surface. Moreover, it is preferred that the second filter holder includes holding arms connected with the floor. Moreover, it is preferred that, when the filter holder is in the first attitude, the placement surface contacts a bottom of a housing of the first filter. Moreover, it is preferred that, when the filter holder is in the second attitude, the holding arms contact a lateral side of a housing of the second filter. The first filter holder includes the floor. The floor has the placement surface. This allows the first filter holder to support the first filter suitably. In addition, the second filter holder includes the holding arms. This allows the second filter holder to support the second filter suitably.

In the example of the present invention described above, it is preferred that the holding arms each extend substantially perpendicularly relative to the placement surface. Accordingly, rotation of the filter holder by approximately 90 degrees achieves displacement from the first attitude to the second attitude. In addition, rotation of the filter holder by approximately 90 degrees also achieves displacement from the second attitude to the first attitude. In this manner, the filter holder allows displacement between the first and second attitudes by a relatively small amount of rotation.

In the example of the present invention described above, it is preferred that the filter holder is disposed below the connection ports, the rotation shaft has an axis extending substantially horizontally. Moreover, it is preferred that, when the filter holder is in the first attitude, the placement surface is substantially horizontal, and the holding arms extend upwardly from the floor. Moreover, it is preferred that, when the filter holder is in the second attitude, the placement surface is substantially vertically, and the holding arms extend substantially horizontally from the floor. The filter holder is disposed below the connection ports. This allows the filter holder to support the first filter and the second filter below the connection ports. When the filter holder is in the first attitude, the placement surface is substantially horizontal. This allows the first filter holder to support the first filter suitably. When the filter holder is in the first attitude, the holding arms extend upwardly. This allows the second filter holder to retract to a position away from the first filter suitably. When the filter holder is in the second attitude, the placement surface is substantially vertical. This allows the first filter holder to retract to a position away from the second filter suitably. When the filter holder is in the second attitude, the holding arms extend substantially horizontally from the floor. This allows the second filter holder to support the second filter suitably.

In the example of the present invention described above, it is preferred that the filter coupling device includes hooks connected with the holding arms, and a first rotation restricting part connected with the leg. Moreover, it is preferred that, when the filter holder is in the first attitude, the first rotation restricting part is disposed in a clearance between the holding arms and the hooks while contacting the hooks. The filter coupling device includes the hooks, and the first rotation restricting part. When the filter holder is in the first attitude, the first rotation restricting part contacts the hooks. This restricts rotation of the filter holder around the rotation shaft. In other words, the filter holder is suitably maintained at the first attitude.

In the example of the present invention described above, it is preferred that the filter coupling device includes a second rotation restricting part connected with the leg. Moreover, it is preferred that, when the filter holder is in the second attitude, the second rotation restricting part is disposed in the clearance while contacting the hooks. The filter coupling device includes the second rotation restricting part. When the filter holder is in the second attitude, the second rotation restricting part contacts the hooks. This restricts rotation of the filter holder around the rotation shaft. In other words, the filter holder is maintainable suitably at the second attitude.

In the example of the present invention described above, it is preferred that, when the filter holder is in the second attitude, the hooks contact a lateral side of the second rotation restricting part. This restricts substantially horizontal movement of the filter holder. Accordingly, a position of the filter holder is maintainable constantly when the filter holder is in the second attitude.

In the example of the present invention described above, it is preferred that the holding arms include proximal end faces connected with the floor, the rotation shaft is connected adjacent to the proximal end faces of the holding arms, and the hooks are connected adjacent to distal end faces of the holding arms. Here, a distance between the hook and the rotation shaft is relatively long. This allows the hooks to restrict rotation of the filter holder around the rotation shaft more suitably.

In the example of the present invention described above, it is preferred that the leg is retained on the base so as to be movable relative to the base. Since the leg is movable relative to the base, the leg allows the filter holder to move relative to the connection ports suitably. Moreover, since the leg is retained on the base, the leg allows the filter holder to move relative to the connection ports more suitably.

Another aspect of the present invention provides a filter coupling device that allows coupling to both a first filter and a second filter with an arrangement of connection openings of the first filter being different from an arrangement of connection openings of the second file. The filter coupling device includes connection ports that allow connection with connection openings of the first filter and connection openings of the second filter, an arrangement switcher configured to hold the connection ports and configured to switch an arrangement of the connection ports between a first arrangement and a second arrangement, the first arrangement corresponding to an arrangement of the connection openings of the first filter and the second arrangement corresponding to an arrangement of the connection openings of the second filter, a filter holder that allows support of the first filter and the second filter, a leg configured to retain the filter holder and move the filter holder toward the connection ports, and a leg restricting part that is movable between a prohibitive position and a permissive position. The leg restricting part in the prohibit position prohibits the leg from moving the filter holder toward the connection ports. The leg restricting part in the permissive position permits the leg to move the filter holder toward the connection ports. When the connection ports are disposed in either the first arrangement or the second arrangement, the leg restricting part is located at the permissive position. When the connection ports are disposed in an arrangement other than the first arrangement and the second arrangement, the leg restricting part is located at the prohibitive position.

The first filter includes a plurality of connection openings. The second filter also includes a plurality of connection openings. The connection openings of the first filter differ from the connection openings of the second filter in arrangement.

The filter coupling device includes the arrangement switcher. Accordingly, the connection ports are able to be located in the first arrangement and the second arrangement, respectively. When the connection ports are located in the first arrangement, the connection ports are connectable with the connection openings of the first filter suitably, and the filter coupling device is also able to be coupled to the first filter suitably. When the connection ports are located in the second arrangement, the connection ports are connectable with the connection openings of the second filter suitably, and the filter coupling device is also able to be coupled to the second filter suitably. In this manner, the filter coupling device is able to be suitably coupled to two or more types of filters having different arrangements of the connection openings. This facilitates replacement among two or more types of filters having different arrangements of the connection openings.

The filter coupling device includes the filter holder and the leg. The filter holder supports the first filter and the second filter. The leg moves the filter holder toward the connection ports. The filter holder and the leg allow the connection openings of the filter supported by the filter holder to be connected with the connection ports suitably.

The filter coupling device includes the leg restricting part. When the connection ports are located either in the first arrangement or in the second arrangement, the leg restricting part is located at the permissive position where the leg restricting part permits connection between the connection openings and the connection ports. Accordingly, the leg restricting part allows the connection ports located either in the first arrangement or in the second arrangement to be connected with the connection openings, i.e., allows appropriate connection. When the connection ports are located in an arrangement other than the first arrangement and the second arrangement, the leg restricting part is located at the prohibitive position where the leg restricting part prohibits connection between the connection openings and the connection ports. Accordingly, the leg restricting part prohibits in advance connection of the connection openings with the connection ports located in the arrangement other than first arrangement and the second arrangement, i.e., prohibits wrong connection. It should be noted that the arrangement of the connection ports other than the first arrangement and the second arrangement means that the connection ports are located in the arrangement different from both the first arrangement and the second arrangement.

In the example of the present invention described above, it is preferred that the filter coupling device further includes an elastic member configured to contact the leg restricting part to apply an elastic force to the leg restricting part, the elastic force being directed from the permissive position to the prohibitive position. When the connection ports are disposed in either the first arrangement or the second arrangement, the arrangement switcher contacts the leg restricting part to position the leg restricting part to the permissive position. When the connection ports are disposed in an arrangement other than the first arrangement and the second arrangement, the arrangement switcher is positioned away from the leg restricting part. When the connection ports are disposed in either the first arrangement or the second arrangement, the arrangement switcher positions the leg restricting part to the permissive position against the elastic force of the elastic member. When the connection ports are disposed in the arrangement other than the first arrangement and the second arrangement, the arrangement switcher is positioned away from the leg restricting part. This causes the elastic member to position the leg restricting part at the prohibitive position. In this manner, the elastic member and the arrangement switcher allow the leg restricting part to be located at the permissive position and the prohibitive position suitably.

In the example of the present invention described above, the following is preferred. That is, the arrangement switcher includes a base, a port moving part supported on the base so as to be movable relative to the base and contacts at least any of the connection ports, a first contacting part connected with the port moving part to be able to contact the leg restricting part, and a second contacting part connected with the port moving part to be able to contact the leg restricting part. When the port moving part is in a first position, the connection ports are disposed in the first arrangement, the first contacting part contacts the leg restricting part to position the leg restricting part to the permissive position, and the second contacting part is positioned away from the leg restricting part. When the port moving part is in a second position, the connection ports are disposed in the second arrangement, the first contacting part is positioned away from the leg restricting part, and the second contacting part contacts the leg restricting part to position the leg restricting part to the permissive position. When the port moving part is in a position other than the first position and the second position, the connection ports are disposed in an arrangement other than the first arrangement and the second arrangement, and the first contacting part and the second contacting part are each positioned away from the leg restricting part.

The port moving part is movable between the first position and the second position. When the port moving part is in the first position, the arrangement switcher positions the connection port in the first arrangement. When the port moving part is in the second position, the arrangement switcher positions the connection port in the second arrangement. In this manner, the port moving part allows switch of the position of the connection ports between the first arrangement and the second arrangement.

The arrangement switcher further includes the first contacting part. When the port moving part is in the first position, the first contacting part locates the leg restricting part at the permissive position. In this manner, when the connection ports are located in the first arrangement, the arrangement switcher is able to locate the leg restricting part at the permissive position suitably.

The arrangement switcher further includes the second contacting part. When the port moving part is in the second position, the second contacting part locates the leg restricting part at the permissive position. In this manner, when the connection ports are located in the second arrangement, the arrangement switcher is able to locate the leg restricting part at the permissive position suitably.

When the port moving part is in the position other than the first position and the second position, the first contacting part and the second contacting part are each positioned away from the leg restricting part. Consequently, when the connection ports are located in an arrangement other than the first arrangement and the second arrangement, the arrangement switcher is able to locate the leg restricting part at the prohibitive position suitably.

In the example of the present invention described above, the following is preferred. That is, the arrangement switcher further includes a port shaft connected with the base. The port moving part is connected with the port shaft so as to be rotatable around the port shaft. The leg restricting part moves between the prohibitive position and the permissive position in a radial direction of the port shaft. Since the port moving part is connected with the port shaft, the port moving part allows suitable rotation relative to the base. This causes the port moving part to switch the position of the connection ports suitably between the first arrangement and the second arrangement. The leg restricting part moves between the prohibitive position and the permissive position in the radial direction of the port shaft. Consequently, the first contacting part and the second contacting part allow the leg restricting part to move suitably from the prohibitive position to the permissive position. It should be noted that the radial direction of the port shaft is a direction perpendicular to the axis of the port shaft.

In the example of the present invention described above, it is preferred that the leg restricting part is positioned so as to overlap the port moving part when seen along an axis of the port shaft. This facilitates contact of the first contacting part and the second contacting part with the leg restricting part.

In the example of the present invention described above, it is preferred that the filter holder is disposed below the connection ports, the leg is movable upwardly relative to the base, the axis of the port shaft is substantially vertical, and the leg restricting part moves between the prohibitive position and the permissive position by moving substantially horizontally relative to the base. The filter holder is disposed below the connection ports, and the leg is movable upwardly relative to the base. Accordingly, the leg allows the filter holder to approach the connection ports suitably. The axis of the port shaft is substantially vertical. Accordingly, the port moving part allows easy movement of the connection ports substantially horizontally. The leg restricting part moves substantially horizontally relative to the base, thereby moving between the prohibitive position and the permissive position. In this manner, the leg restricting part moves substantially perpendicularly relative to the direction where the leg moves. Consequently, the leg restricting part prohibits and permits upward movement of the leg relative to the base easily.

In the example of the present invention described above, it is preferred that the leg is retained by the arrangement switcher so as to be movable relative to the arrangement switcher. Since the leg is retained by the arrangement switcher, the leg allows the filter holder to move toward the connection ports suitably.

Another aspect of the present invention provides a substrate treating apparatus having a filter coupling device that is able to be coupled to both a first filter and a second filter with different shapes. The filter coupling device includes connection ports that allow connection with a connection opening of the first filter and a connection opening of the second filter, a base configured to support the connection ports, a filter holder that allows support of the first filter and the second filter, a rotation shaft connected with the filter holder, and a leg configured to retain the rotation shaft. The filter holder takes a first attitude and a second attitude by rotating around the rotation shaft. The filter holder includes a first filter holder configured to support the first filter in the first attitude, and a second filter holder configured to support the second filter in the second attitude.

The substrate treating apparatus includes the filter coupling device. The filter coupling device is able to be coupled to two or more types of filters suitably with different shapes. This facilitates replacement among two or more types of filters with different shapes.

Another aspect of the present invention provides a substrate treating apparatus having a filter coupling device that allows connection to both a first filter and a second filter with an arrangement of connection openings of the first filter being different from an arrangement of connection openings of the second filer. The filter coupling device includes connection ports that allows connection with the connection openings of the first filter and the connection openings of the second filter, an arrangement switcher that is configured to hold the connection ports and switch an arrangement of the connection ports between a first arrangement and a second arrangement, the first arrangement corresponding to the arrangement of the connection openings of the first filter and the second arrangement corresponding to the arrangement of the connection openings of the second filter, a filter holder that allows support of the first filter and the second filter, a leg that is configured to retain the filter holder and causes the filter holder to move toward the connection ports, and a leg restricting part that is movable between a prohibitive position and a permissive position. The leg restricting part in the prohibit position prohibits the leg from moving the filter holder toward the connection ports. The leg restricting part in the permissive position permits the leg to move the filter holder toward the connection ports. When the connection ports are located in either the first arrangement or the second arrangement, the leg restricting part is located at the permissive position. When the connection ports are located in an arrangement other than the first arrangement and the second arrangement, the leg restricting part is located at the prohibitive position.

The substrate treating apparatus includes the filter coupling device. The filter coupling device is able to be coupled to two or more types of filters suitably with different arrangements of the connection openings. This facilitates replacement among two or more types of filters with different arrangements of the connection openings.

The present specification also discloses the inventions of the filter coupling device as under.

(1) In the filter coupling device mentioned above, the filter coupling device includes a filter restricting part connected with the leg, wherein the filter restricting part contacts at least either the first filter or the second filter supported by the filter holder, and restricts displacement of at least either the first filter or the second filter relative to the leg toward the connection port.

With the filter coupling device described in the above description (1), the filter coupling device includes the filter restricting part. The filter restricting part restricts movement of at least either the first filter or the second filter relative to the leg toward the connection ports. Consequently, when the leg is moved away from the connection ports, the filter restricting part allows at least either the first filter or the second filter to move away from the connection ports. More specifically, when the leg is moved away from the connection ports, the filter restricting part allows suitable separation of at least either the first filter or the second filter from the connection ports.

(2) In the filter coupling device mentioned above, the connection ports each include an opening formed at a first end face of each of the connection ports; a planar end face formed around the opening; and a sloped peripheral face formed around the planar end face and sloped outwardly in a radial direction toward a second end face of each of the connection ports, wherein at least either the planar end face or the sloped peripheral face contacts each of the connection openings.

With the filter coupling device according to the above description (2), the connection ports each have the planar end face and the sloped peripheral face. Consequently, the connection ports allow suitably connection with two or more types of connection openings with different configurations.

(3) In the filter coupling device mentioned above, the filter coupling device includes a pin connected with the leg; and a lever that contacts the pin to move the pin substantially vertically relative to the connection ports, wherein a vertical virtual line, running through the pin seen along an axis of the pin, intersects a center portion of at least either the first filter or the second filter supported by the filter holder.

With the filter coupling device according to the above description (3), the filter coupling device includes the pin and the lever. The pin and the lever facilitate movement of the leg substantially vertically. The vertical virtual line, running through the pin seen along the axis the pin, intersects the center portion of at least either first filter or the second filter supported by the filter holder. Consequently, the pin and the lever allow the leg and filter holder entirely to move substantially vertically in good balance. This achieves movement of the entire first filter and/or the second filter in good balance. As a result, all the connection openings of the first filter and/or the second filter are connectable suitably with the connection ports, respectively.

(4) In the filter coupling device mentioned above, the hooks each include a first face; and a second face different from the first surface; wherein when the filter holder is in the second attitude, the second rotation restricting part contacts the first face and the second face of each of the hooks.

With the filter coupling device according to the above description (4), when the filter holder is in the second attitude, the position of the filter holder is able to remain fixed. It should be noted that the second face different from the first face means that the second face is not flush with the first face.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 13 is a partially enlarged side view of the filter coupling device.
FIG. 21A illustrates a mechanism for keeping the filter holder at a second attitude.
FIG. 21B illustrates a mechanism for keeping the filter holder at a second attitude.
FIG. 21C illustrates a mechanism for keeping the filter holder at a second attitude.
FIG. 22A illustrates a procedure of removably attaching the first filter to the filter coupling device.
FIG. 22B illustrates a procedure of removably attaching the first filter to the filter coupling device.
FIG. 22C illustrates a procedure of removably attaching the first filter to the filter coupling device.
FIG. 23A illustrates a procedure of removably attaching the first filter to the filter coupling device.
FIG. 23B illustrates a procedure of removably attaching the first filter to the filter coupling device.
FIG. 23C illustrates a procedure of removably attaching the first filter to the filter coupling device.
FIG. 24A illustrates a procedure of removably attaching the second filter to the filter coupling device.
FIG. 24B illustrates a procedure of removably attaching the second filter to the filter coupling device.
FIG. 24C illustrates a procedure of removably attaching the second filter to the filter coupling device.

DESCRIPTION OF EMBODIMENTS

Figure 1:
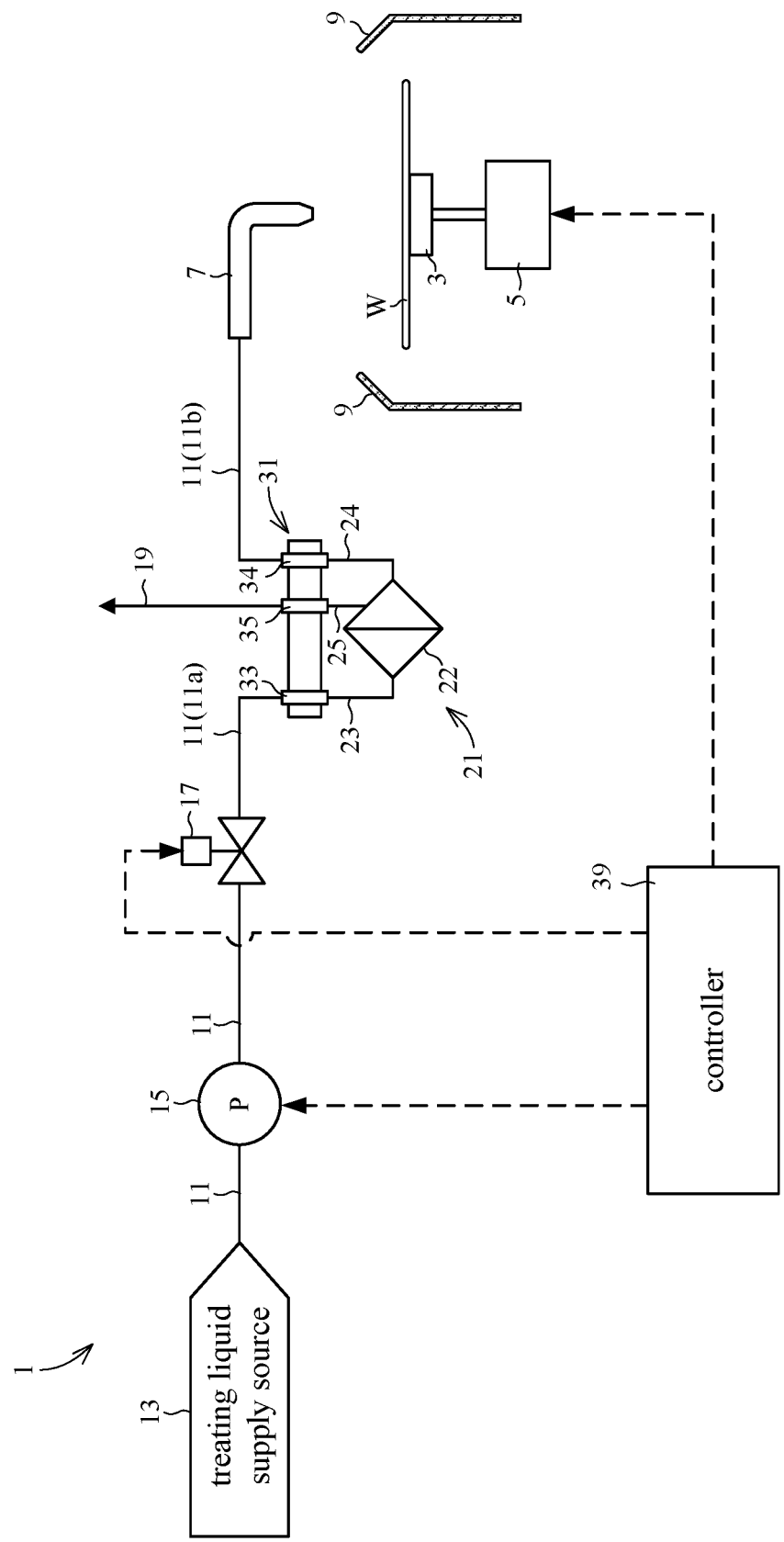
FIG. 1 schematically illustrates a substrate treating apparatus according to one embodiment.

The following describes embodiments of the present invention with reference to drawings. FIG. 1 schematically illustrates a substrate treating apparatus according to one embodiment. The substrate treating apparatus 1 according to this embodiment is an apparatus for treating substrates (e.g. semiconductor wafers) W with a liquid.

1. Outline of Substrate Treating Apparatus 1

The substrate treating apparatus 1 includes a substrate holder 3 and a spin motor 5. The substrate holder 3 supports a wafer W substantially horizontally. The substrate holder 3 supports a back side (lower surface) of the wafer W by suction, for example. The spin motor 5 is connected with a center portion of a bottom of the substrate holder 3. The spin motor 5 spins the substrate holder 3 around a substantially vertical axis. Consequently, the wafer W held by the substrate holder 3 spins around the substantially vertical axis passing through a center portion of the wafer W.

The substrate treating apparatus 1 further includes a nozzle 7 and a cup 9. The nozzle 7 is provided movable to a dispense position above the substrate holder 3. The nozzle 7 dispenses a treating liquid to the substrate W held by the substrate holder 3. The cup 9 is disposed surrounding laterally of the substrate holder 3. The cup 9 catches and collects the treating liquid scattering from the substrate W.

The nozzle 7 includes piping 11 that delivers the treating liquid. The piping 11 has a first end that is connected with the nozzle 7. The piping 11 has a second end that is connected with a treating liquid supply source 13. The treating liquid supply source 13 is, for example, a treating liquid tank storing the treating liquid. The treating liquid is, for example, a resist film material, a varied type of film material, a chemical solution, thinner, or deionized water. The piping 11 has a pump 15, a control valve 17, and a filter 21 mounted thereon. The pump 15 feeds under pressure the treating liquid from the treating liquid supply source 13 toward the nozzle 11. The control valve 17 opens and closes a flow path of the treating liquid. The filter 21 filters the treating liquid. The filter 21 separates and removes foreign substances from the treating liquid, for example.

The filter 21 has a filter body 22 and a plurality of (e.g. three) connection openings 23, 24 and 25. The filter body 22 includes a filtering material, a primary side flow path where the treating liquid flows, and a secondary side flow path where the treating liquid flows (none being shown). The primary side flow path is formed on a primary side of the filtering material. The secondary side flow path is formed on a secondary side of the filtering material. The filtering material is, for example, a porous film. The connection opening 23 is an inlet of the primary side flow path. The connection opening 24 is an outlet of the secondary side flow path. The connection opening 25 is an outlet for letting gas out of the filter body 22.

The filter 21 is connected with the piping 11 by a filter coupling device 31. The filter coupling device 31 has a plurality (e.g. the same in number as the connection openings) of joint members 33, 34 and 35. The joint members 33, 34 and 35 are connected with the connection openings 23, 24 and 25, respectively. The joint members 33, 34 and 35 are one example of the connection ports in the present invention.

Here for convenience, a first portion of the piping 11 disposed on the primary side of the filter 21 is to be referred to as "primary piping 11a", and a second portion of the piping 11 disposed on the secondary side of the filter 21 is to be referred to as "secondary piping 11b." The primary piping 11a is connected with the joint member 33. Consequently, the primary piping 11a is in connection with the connection opening 23 through the joint member 33 in a communicated manner. The secondary piping 11b is connected with the joint member 34. Consequently, the secondary piping 11b is in connection with the connection opening 24 through the joint member 34 in a communicated manner. The joint member 35 is connected with a vent pipe 19. Consequently, the vent pipe 19 is in connection with the connection opening 25 through the joint member 35 in a communicated manner. The vent pipe 19 is opened to the atmosphere.

The substrate treating apparatus 1 has a controller 39. The controller 39 performs overall control of the rotation of the spin motor 5, movement of the nozzle 7, driving of the pump 15, and opening and closing of the control valve 17. The control by the controller 39 is performed based on a processing recipe set beforehand.

Operation of the substrate treating apparatus 1 for treating the substrate W with the liquid is to be described briefly.

When the substrate W is placed on the substrate holder 3, the spin motor 5 spins the substrate W. The nozzle 7 moves to the dispense position. The pump 15 feeds the treating liquid under pressure, and the control valve 17 opens the flow path of the treating liquid. Consequently, the treating liquid flows from the treating liquid supply source 13 through the primary side piping 11a into the filter 21. The filter 21 filters the treating liquid. The filtered treating liquid flows from the filter 21 through the secondary side piping 11b into the nozzle 7. The nozzle 7 dispenses the treating liquid to the substrate W. The treating liquid reaches a center portion of the surface of the spinning substrate W, and spreads over the entire front face of the wafer W. The treating liquid scattering from the substrate W is collected by the cup 9.

Upon elapse of a predetermined time after start of dispensing the treating liquid, the pump 15 is stopped and the control valve 17 is closed to stop supply of the treating liquid to the substrate W. The spin motor 5 spins the substrate W at higher speed to dry the substrate W. Then, the spin motor 5 stops to bring the substrate W to a standstill. This completes the liquid treatment of the substrate W.

2. Configuration of Filter 21

The Configurations of two types of filters 21 will be described by way of example.

Figure 2A:
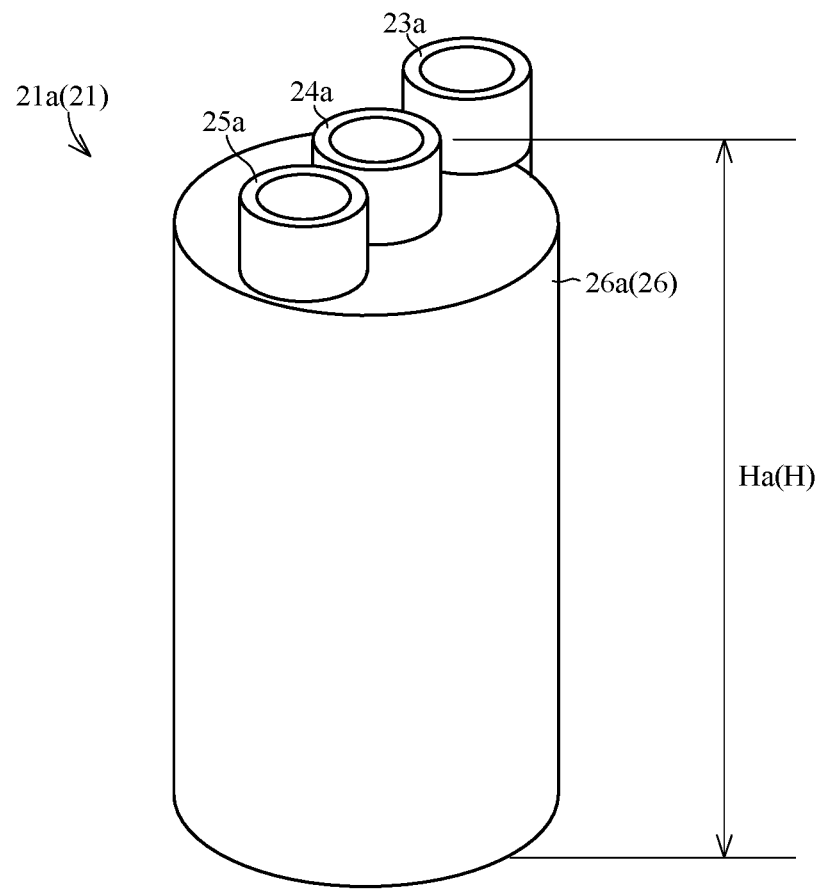
FIG. 2A is a perspective view of a first filter.
Figure 2B:
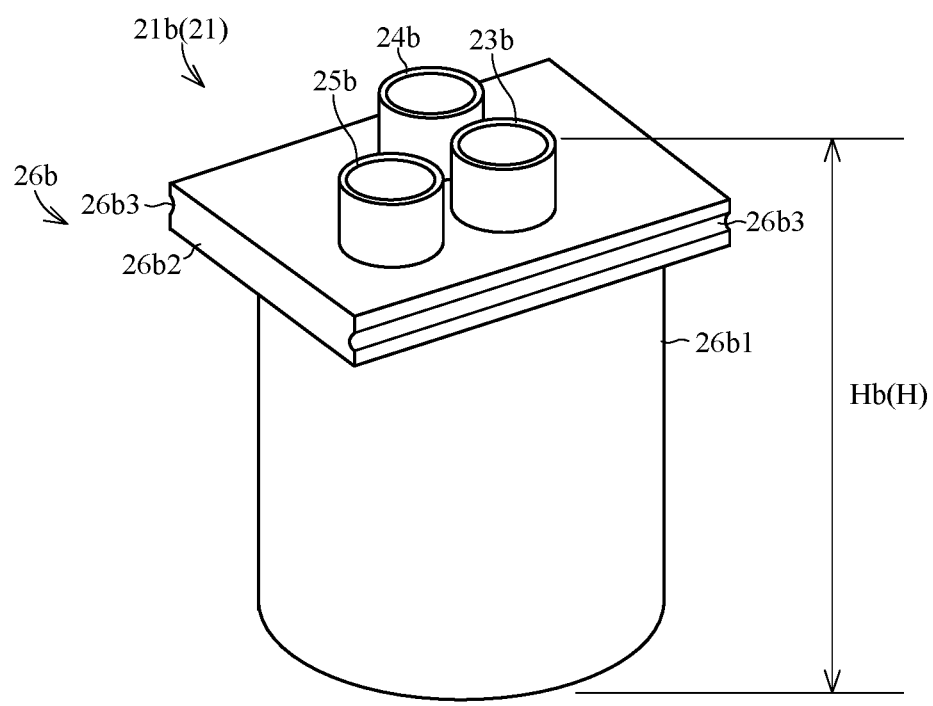
FIG. 2B is a perspective view of a second filter.

FIG. 2A is a perspective view of a first example of the filter 21. FIG. 2B is a perspective view of a second example of the filter 21. In the following description, the first example of the filter 21 is to be referred to as "first filter 21a", and the second example of the filter 21 "second filter 21b." The numeral of each element of the first filter 21a will be affixed with "a" as appropriate, and the numeral of each element of the second filter 21b with "b"

Reference is made to FIG. 2A. The first filter 21a has connection openings 23a, 24a and 25a. The connection openings 23a, 24a and 25a each have a tubular shape. Reference is made to FIG. 2B. The second filter 21b has connection openings 23b, 24b and 25b. The connection openings 23b, 24b and 25b each have a tubular shape. The joint members 33, 34 and 35 are connectable with the connection openings 23a, 24a and 25a, respectively. The joint members 33, 34 and 35 are connectable with the connection openings 23b, 24b and 25b, respectively.

Thus, the first filter 21a and second filter 21b differ from each other in arrangement of the connection openings 23, 24, and 25. Reference is made to FIG. 2A. The connection openings 23a, 24a and 25a are arranged in a row. Reference is made to FIG. 2B. The connection openings 23b, 24b and 25b are not arranged in a row. The connection openings 23b, 24b and 25b are arranged in positions like three vertices of a right triangle, respectively. Consequently, the arrangement of the connection openings 23a, 24a, and 25a of the first filter 21a is different from the arrangement of the connection openings 23b, 24b, and 25b of the second filter 21b.

Moreover, the first filter 21a and the second filter 21b differ from each other in shape. Reference is made to FIG. 2A. The first filter 21a has a housing 26a. The housing 26a accommodates the filter body 22. The connection openings 23a, 24a and 25a are formed in an upper surface of the housing 26a. Reference is made to FIG. 2B. The second filter 21b has a housing 26b. The housing 26b accommodates the filter body 22. The connection openings 23b, 24b and 25b are formed in the upper surface of the housing 26b.

The first filter 21a and second filter 21b differ from each other in height H of the filters 21. In this embodiment, a height Ha of the first filter 21a is larger than a height Hb of the second filter 21b. Here, the height H of the filter 21 corresponds to a length in the vertical direction from the bottom of the housing 26 to upper ends of the connection openings 23 to 25.

The first filter 21a and the second filter 21b differ from each other in shape of the housing 26. The housing 26b of the second filter 21b includes a cylinder portion 26b1, a flange portion 26b2, and a groove 26b3. The flange portion 26b2 is arranged on the cylinder portion 26b1. The groove 26b3 is formed on each side of the flange portion 26b2. The connection openings 23b, 24b, and 25b are arranged on the flange portion 26b2. The housing 26a of the first filter 21a has no member corresponding to the flange portion 26b2. Consequently, the shape of the second filter 21b is different from the shape of the first filter 21a.

3. Configuration of Filter Coupling Device 31

Figure 3:
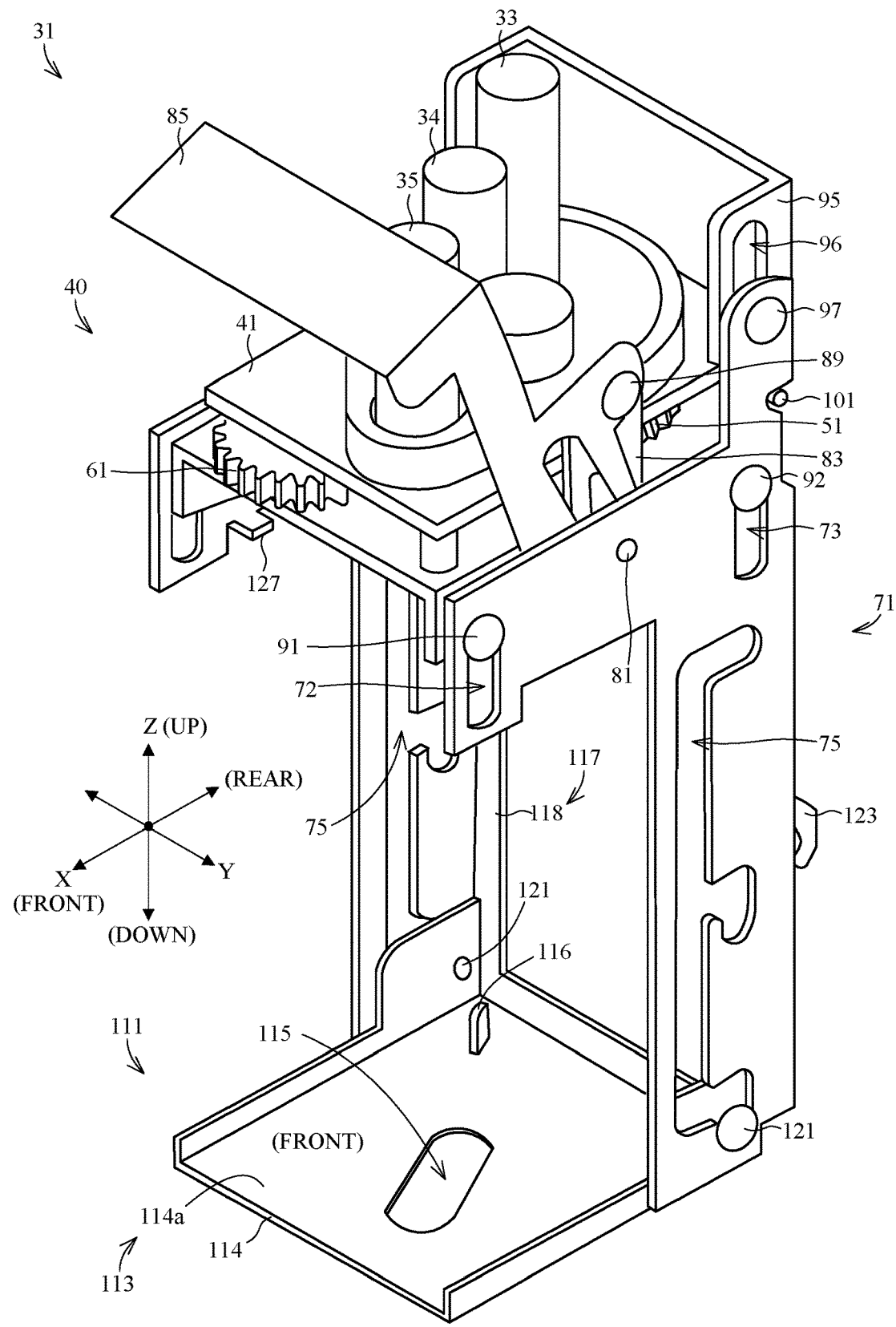
FIG. 3 is a perspective view of a filter coupling device.
Figure 4:
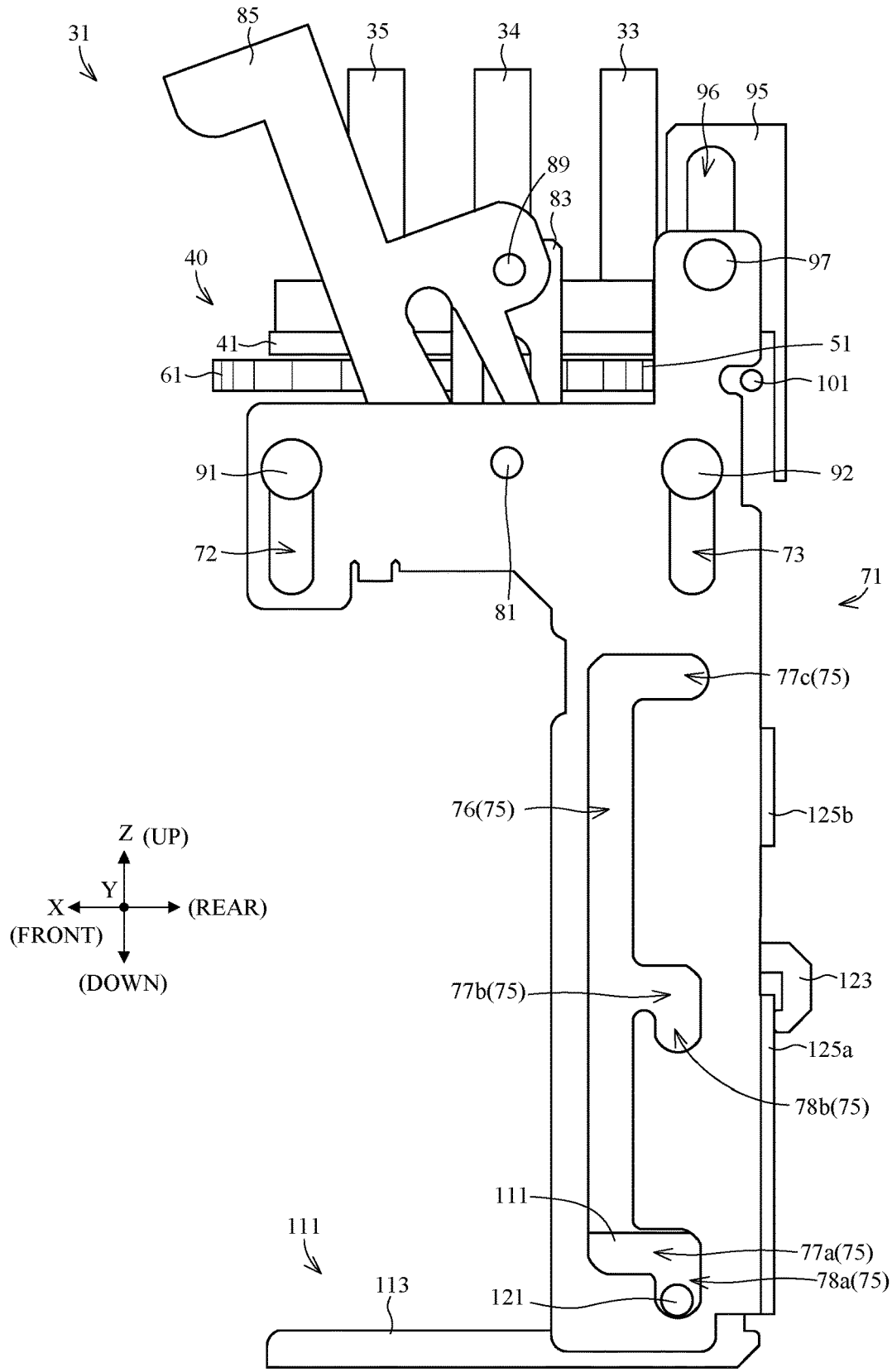
FIG. 4 is a side view of the filter coupling device.

FIG. 3 is a perspective view of the filter coupling device 31. FIG. 4 is a side view of the filter coupling device 31.

In FIGS. 3 and 4, a longitudinal direction is indicated by X, a width direction by Y, and a vertical direction by Z. The longitudinal direction X, the width direction Y, and the vertical direction Z are orthogonal to one another. The longitudinal direction X and the width direction Y are each horizontal. One side of the longitudinal direction X is referred to as a "forward" side, and the other side as a "rearward" side. The "horizontal direction" or simply the "lateral side" is used when no distinction is made between the longitudinal direction X and the width direction Y. Moreover, one side of the vertical direction Z is referred to as an "upper" side, and the other side of the vertical direction Z as a "lower" side.

The filter coupling device 31 is able to be coupled to any of the first filter 21a and the second filter 21b. The filter coupling device 31 includes an arrangement switcher 40, a leg 71, and a filter holder 111. The arrangement switcher 40 switches the arrangement of the joint members 33 to 35. The filter holder 111 supports the filter 21. The leg 71 retains the filter holder 111. The following describes this in detail.

3.1. Configuration of Arrangement Switcher 40

The arrangement switcher 40 supports a plurality of joint members 33 to 35.

The arrangement switcher 40 switches the arrangement of the joint members 33 to 35. Specifically, the arrangement switcher 40 switches between a first arrangement and a second arrangement of the joint members 33 to 35. The first arrangement corresponds to the arrangement of the connection openings 23a to 25c of the first filter 21a. The second arrangement corresponds to the arrangements of the connection openings 23b to 25b of the second filter 21b.

The arrangement switcher 40 includes a base plate 41. The base plate 41 is in form of a substantially horizontal plate.

Figure 5:
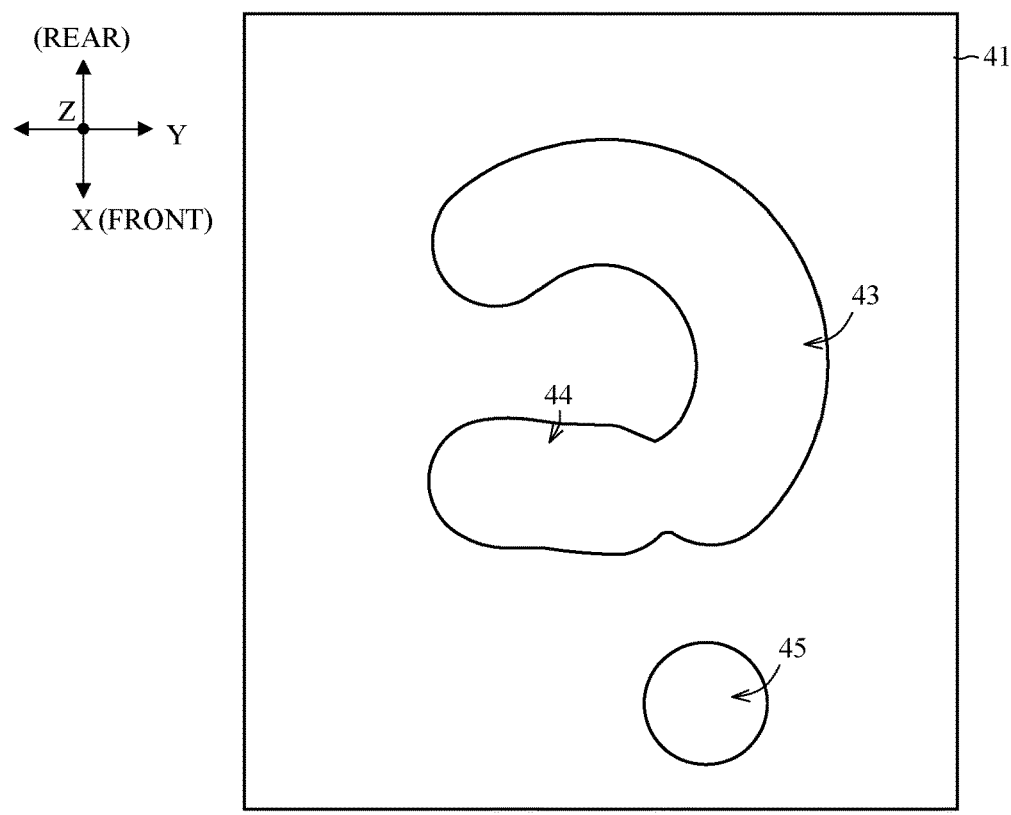
FIG. 5 is a plan view of a base plate.

FIG. 5 is a plan view of the base plate 41. The base plate 41 has apertures 43, 44, and 45. The joint member 33 is disposed in the aperture 43. The joint member 34 is disposed in the aperture 44. The joint member 35 is disposed in the aperture 45.

The apertures 43 and 44 are long holes. The joint member 33 is movable substantially horizontally in the aperture 43. The joint member 34 is movable substantially horizontally in the aperture 44. The aperture 45 is slightly larger than a cross section of the joint member 35. The joint member 35 is immovable substantially horizontally in the aperture 45. As noted above, the joint members 33 and 34 are movable substantially horizontally relative to the base plate 41. The joint member 35 is immovable substantially horizontally relative to the base plate 41.

Figure 6:
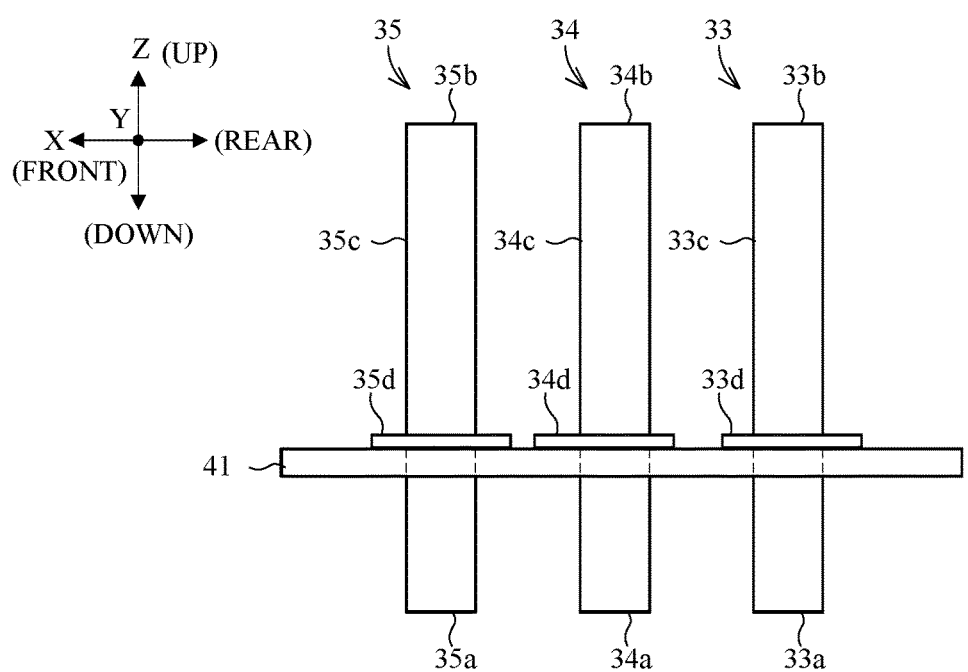
FIG. 6 is a side view of the base plate and joint members.

FIG. 6 is a side view of the base plate 41 and the joint members 33 to 35. The joint member 33 has a tubular shape extending substantially linearly. The joint member 33 is inserted into the aperture 43 in a substantially vertical attitude. The joint member 33 includes a first end face 33a connected with the connection opening 23, and a second end face 33b connected with the primary side piping 11a. The joint member 33 is arranged while the first 33a face is located on the lower side and the second end face 33b is located on the upper side. The first end face 33a is located below the base plate 41. The second end 33b is located above the base plate 41.

The joint member 33 includes an outer peripheral face 33c, and a flange portion 33d protruding from the outer peripheral face 33c. The flange portion 33d is larger than a width of the aperture 43. The flange portion 33d is mounted on an upper face of the base plate 41. The joint member 33 does not drop off forwardly from the aperture 43. Consequently, the base plate 41 contacts the joint member 33. The base plate 41 supports the joint member 33.

The joint members 34 and 35 each have the substantially same configuration as the joint member 33. The joint member 34 includes a first end face 34a, a second end face 34b, an outer peripheral face 34c, and a flange portion 34d. The joint member 35 includes a first end face 35a, a second end face 35b, an outer peripheral face 35c, and a flange portion 35d. The joint members 34 and 35 are individually arranged on the base plate 41 in the substantially same manner as the joint member 33. The base plate 41 contacts the joint members 34 and 35, respectively. The base plate 41 supports the joint members 34 and 35, respectively. The base plate 41 is one example of the base in the present invention.

Reference is made to FIGS. 3 and 4. The arrangement switcher 40 further includes a moving part 51 and an operating part 61. The moving part 51 moves the joint members 33 and 34. The operating part 61 is interlocked to the moving part 51. The operating part 61 is operated by a user. The moving part 51 moves the joint members 33 and 34 in accordance with operation of the operating part 61.

Figure 7:
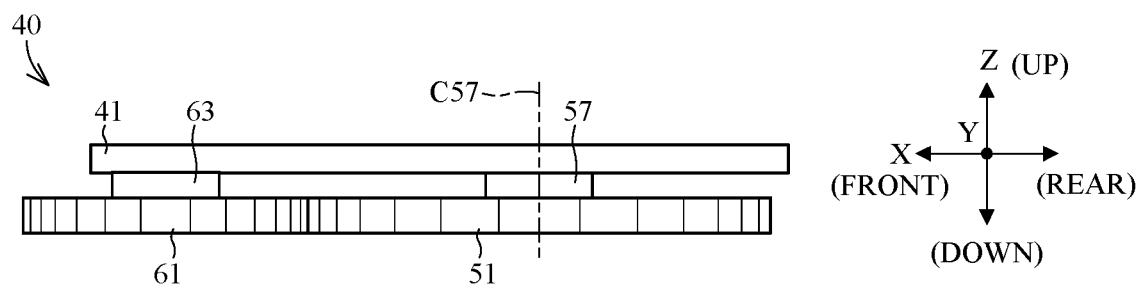
FIG. 7 is a partial side view of the filter coupling device.
Figure 8:
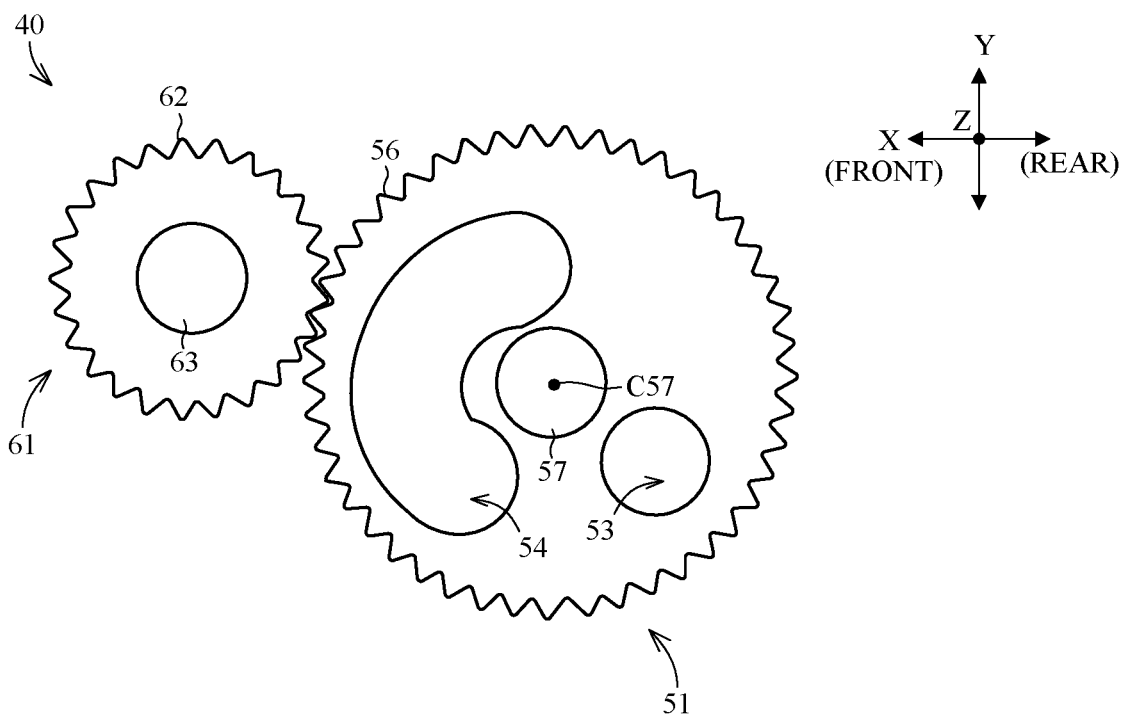
FIG. 8 is a plan view of a moving part and an operating part.

FIG. 7 is a partial side view of the arrangement switcher 40. FIG. 8 is a plan view of the moving part 51 and the operating part 61. The arrangement switcher 40 includes a joint shaft 57. The joint shaft 57 is connected with the base plate 41. An axis C57 of the joint shaft 57 is substantially vertically. The moving part 51 is connected with the joint shaft 57. The moving part 51 is supported on the base plate 41 via the joint shaft 57. The moving part 51 is rotatable around the joint shaft 57. The moving part 51 is movable relative to the base plate 41.

Reference is made to FIG. 8. The moving part 51 is substantially circular in plan view. The joint shaft 57 is connected with a center portion of the moving part 51 in plan view.

The moving part 51 includes apertures 53 and 54. The joint member 33 is disposed in the aperture 53. The joint member 34 is disposed in the aperture 54.

The aperture 53 is slightly larger than a cross section of the joint member 33. The joint member 33 is immovable substantially horizontally in the aperture 53. The joint member 33 is immovable substantially horizontally relative to the moving part 51. The joint member 33 and the moving part 51 move integrally. When the moving part 51 rotates, the joint member 33 moves relative to the base plate 41.

The aperture 54 is a long hole. The joint member 34 is movable substantially horizontally in the aperture 54. The joint member 34 is movable substantially horizontally relative to the moving part 51. When the moving part 51 rotates while either a first edge or a second edge of the aperture 54 contacts the joint member 34, the joint member 34 moves relative to the base plate 41.

As noted above, the moving part 51 contacts the joint members 33 and 34. The moving part 51 moves the joint members 33 and 34.

The moving part 51 has teeth 56. The teeth 56 are formed on an outer peripheral edge of the moving part 51.

Reference is made to FIGS. 7 and 8. The arrangement switcher 40 includes an operational shaft 63. The operational shaft 63 is connected with the base plate 41. The operating part 61 is connected with the operational shaft 63. The operating part 61 is supported on the base plate 41 via the operational shaft 63. The operating part 61 is rotatable around the operational shaft 63. The operating part 61 has a front end located forwardly of the base plate 41.

Reference is made to FIG. 8. The operating part 61 is substantially circular in plan view. The operating part 61 has teeth 62. The teeth 62 are formed on the outer peripheral edge of the operating part 61. The teeth 62 engage the teeth 56.

The user causes the operating part 61 to rotate around the operational shaft 63. The moving part 51 rotates around the joint shaft 57 in synchronization with the rotation of the operating part 61. The position of the moving part 51 relative to the base plate 41 varies in accordance with the rotation of the moving part 51. Specifically, the angle of the moving part 51 relative to the base plate 41 varies in accordance with the rotation of the moving part 51. Moreover, the joint members 33 and 34 move relative to the base plate 41 in accordance with the rotation of the moving part 51.

Figure 9A:
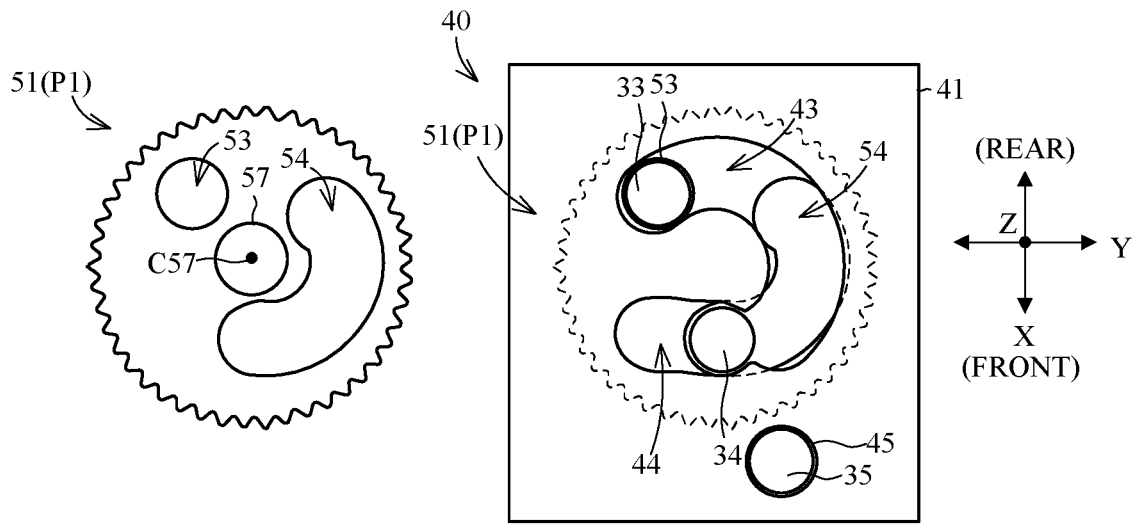
FIG. 9A illustrates switching of an arrangement of the joint members.
Figure 9B:
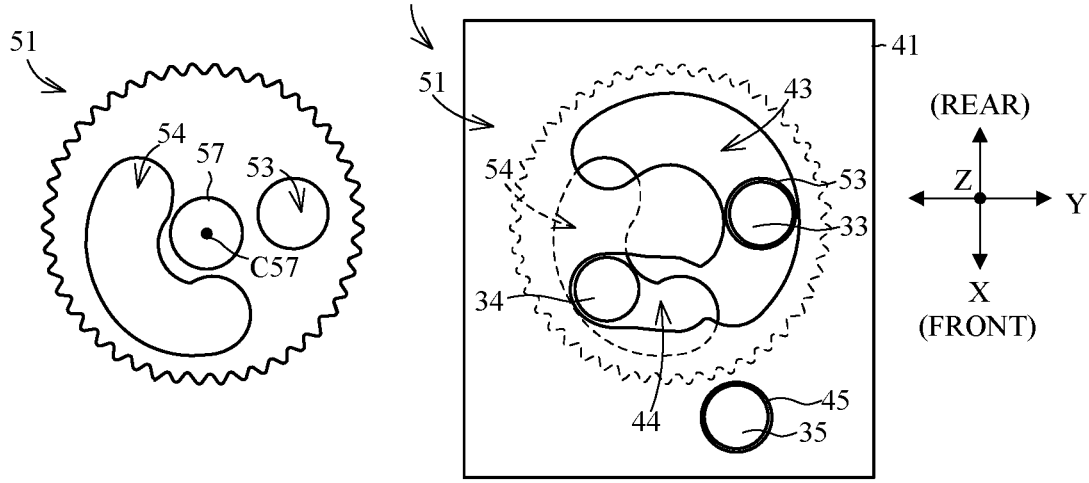
FIG. 9B illustrates switching of an arrangement of the joint members.
Figure 9C:
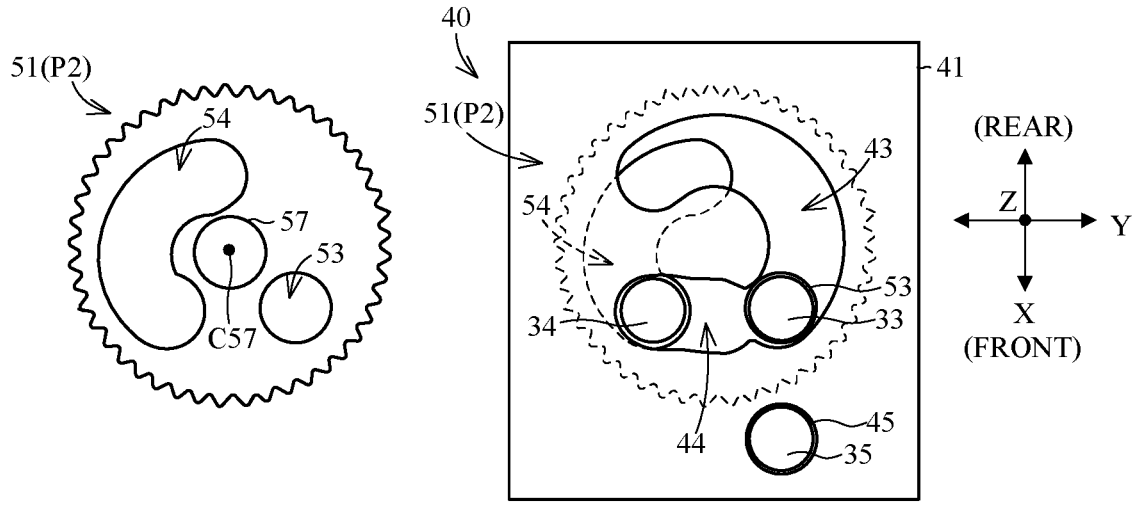
FIG. 9C illustrates switching of an arrangement of the joint members.

FIGS. 9A, 9B, and 9C each illustrate switching of the arrangement of the joint members 33 to 35. FIGS. 9A, 9B, and 9C each illustrate on the right thereof a plan view of the joint members 33 to 35, the base plate 41, and the moving part 51. FIGS. 9A, 9B, and 9C each illustrate on the left thereof a plan view of only the moving part 51.

As seen in FIGS. 9A, 9B, and 9C, the joint members 33 and 34 move relative to the base plate 41 in accordance with the rotation of the moving part 51.

Reference is made to FIG. 9A. The joint members 33 to 35 are located in the first arrangement. The joint member 33 is positioned by the moving part 51. The joint member 34 gets caught between a first edge of the aperture 44 and the first edge of the aperture 54. That is, the joint member 34 is positioned by the base plate 41 and the moving part 51. The joint member 35 is positioned by the base plate 41.

Reference is made to FIG. 9C. The joint members 33 to 35 are located in the second arrangement. The joint member 33 is positioned by the moving part 51. The joint member 34 gets caught between a second edge of the aperture 44 and the second edge of the aperture 54. That is, the joint member 34 is positioned by the base plate 41 and the moving part 51. The joint member 35 is positioned by the base plate 41.

The first arrangement differs from the second arrangement in position of the joint member 33 relative to the base plate 41. Moreover, the first arrangement differs from the second arrangement in position of the joint member 34 relative to the base plate 41. In contrast to this, the first arrangement is equal to the second arrangement in position of the joint member 35 relative to the base plate 41.

Hereunder, the position of the moving part 51 in FIG. 9A is referred to as a "first position P1". Hereunder, the position of the moving part 51 in FIG. 9C is referred to as a "second position P2".

Reference is made to FIG. 9B. The moving part 51 is located at a position different from both the first position P1 and the second position P2. When the moving part 51 is located at the position other than the first position P1 and the second position P2, the joint members 33 to 35 are located in an arrangement other than the first arrangement and the second arrangement.

Here, the moving part 51 is located at the position other than the first position P1 and the second position P2 while the moving part 51 is moved from the first position P1 to the second position P2. The moving part 51 is located at the position other than the first position P1 and the second position P2 even while moving from the second position P2 to the first position P1. Consequently, the arrangement of the joint members 33 to 35 is an arrangement other than the first arrangement and the second arrangement while the arrangement of the joint members 33 to 35 is switched between the first arrangement and the second arrangement. It should be noted that the arrangement other than the first arrangement and the second arrangement is the arrangement different from the first arrangement and the second arrangement.

As noted above, when the moving part 51 is located at the first position P1, the arrangement of the joint members 33 to 35 corresponds to the first arrangement (see FIG. 9A). When the moving part 51 is located at the second position P2, the arrangement of the joint members 33 to 35 corresponds to the second arrangement (see FIG. 9B). When the moving part 51 is located at the position other than the first position P1 and the second position P2, the arrangement of the joint members 33 to 35 corresponds to the arrangement other than the first arrangement and second arrangement (see FIG. 9C).

The moving part 51 is one example of the port moving part in the present invention. The joint shaft 57 is one example of the port shaft in the present invention.

3.2. Attachment Configuration of Leg 71

Reference is made to FIGS. 3 and 4. The leg 71 is retained on the base plate 41. The leg 71 is disposed outwardly from the base plate 41 in the width direction Y. Specifically, the leg 71 is disposed on first and second sides of the base plate 41 in the width direction Y. The leg 71 extends in the substantially vertical direction Z. The leg 71 is movable relative to the base plate 41 and the joint members 33 to 35. The leg 71 is movable relative to the base plate 41 and the joint members 33 to 35 in the vertical direction Z.

The filter coupling device 31 includes a pin 81. The pin 81 is connected with the leg 71. The pin 81 is fixed on the leg 71. The pin 81 has a substantially horizontal axis. Specifically, the axis of the pin 81 is substantially parallel to the width direction Y.

The filter coupling device 31 further includes a pin guiding unit 83, a lever 85, and a lever rotating shaft 89. The pin guiding unit 83 guides the pin 81 in the vertical direction Z. The lever 85 moves the pin 81. The lever rotating shaft 89 is connected with the lever 85. The lever rotating shaft 89 retains the lever 85. The lever 85 is rotatable around the lever rotating shaft 85.

Figure 10:
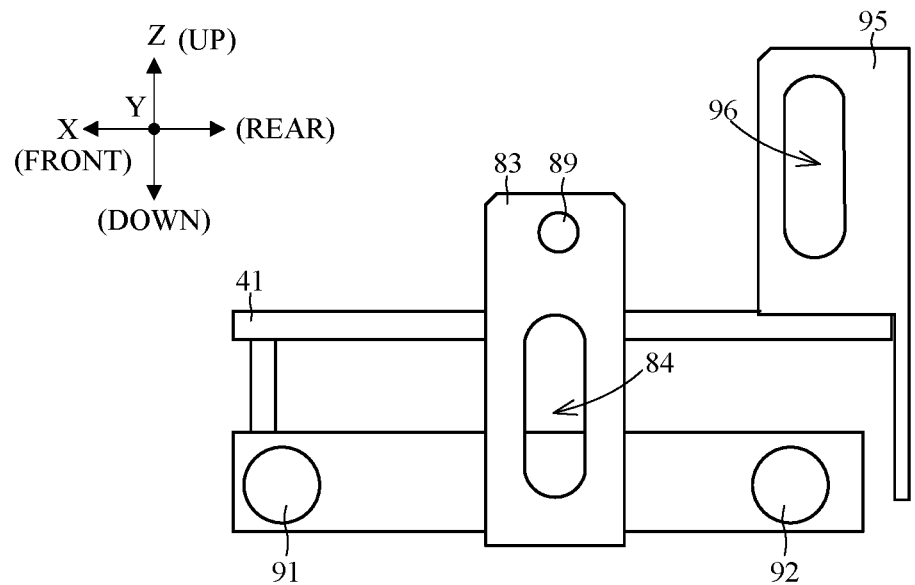
FIG. 10 is a side view of the base plate, a pin guiding unit, and a lever rotation shaft.

FIG. 10 is a side view of the base plate 41, the pin guiding unit 83, and the lever rotating shaft 89. The pin guiding unit 83 is connected with the base plate 41. The pin guiding unit 83 is fixed on the base plate 41.

The pin guiding unit 83 includes an aperture 84. The pin 81 is disposed in the aperture 84. The aperture 84 is a long hole. The aperture 84 extends in the substantially vertical direction Z. The pin 81 is movable in the aperture 84 in the substantially vertical direction Z.

The lever rotating shaft 89 is connected with the pin guiding unit 83. That is, the lever rotating shaft 89 is supported on the base plate 41. The lever rotating shaft 89 is disposed above the aperture 84. The lever rotating shaft 89 has a substantially horizontal axis. Specifically, the axis of the lever rotating shaft 89 is substantially parallel to the width direction Y.

Figure 11:
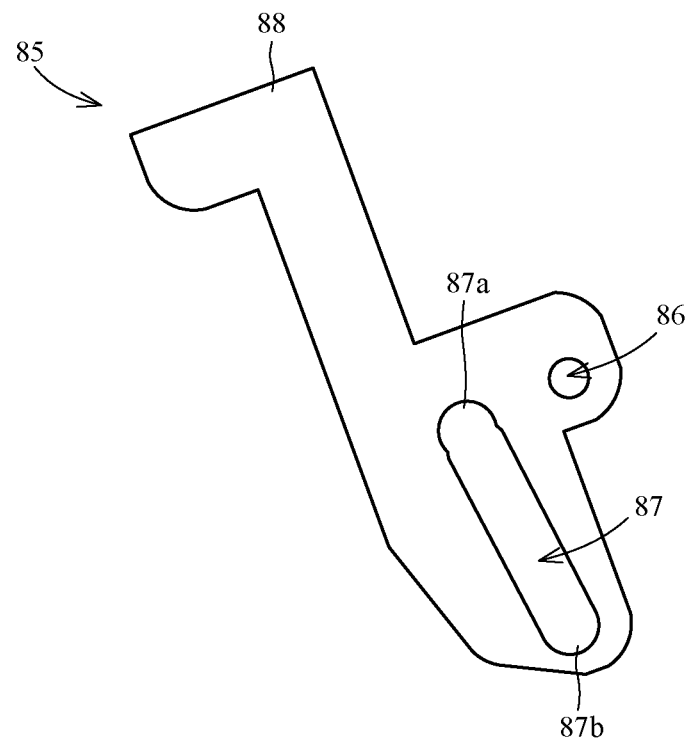
FIG. 11 is a side view of a lever.

FIG. 11 is a side view of the lever 85. The lever 85 has apertures 86 and 87. The lever rotating shaft 89 is disposed in the aperture 86. The pin 81 is disposed in the aperture 87. The lever 85 contacts the pin 81. The aperture 87 is a long hole. The pin 81 is movable in the aperture 87. The aperture 87 has a first end face 87a and a second end face 87b. The first end face 87a is closer to the aperture 86 (lever rotating shaft 89) than the second end face 87b.

The lever 85 has a handle 88. The handle 88 is grasped by the user. The lever 85 rotates around the lever rotating shaft 89 relative to the base plate 41 in accordance with operation of the handle 88 by the user.

Figures 12A, 12B, 12C:
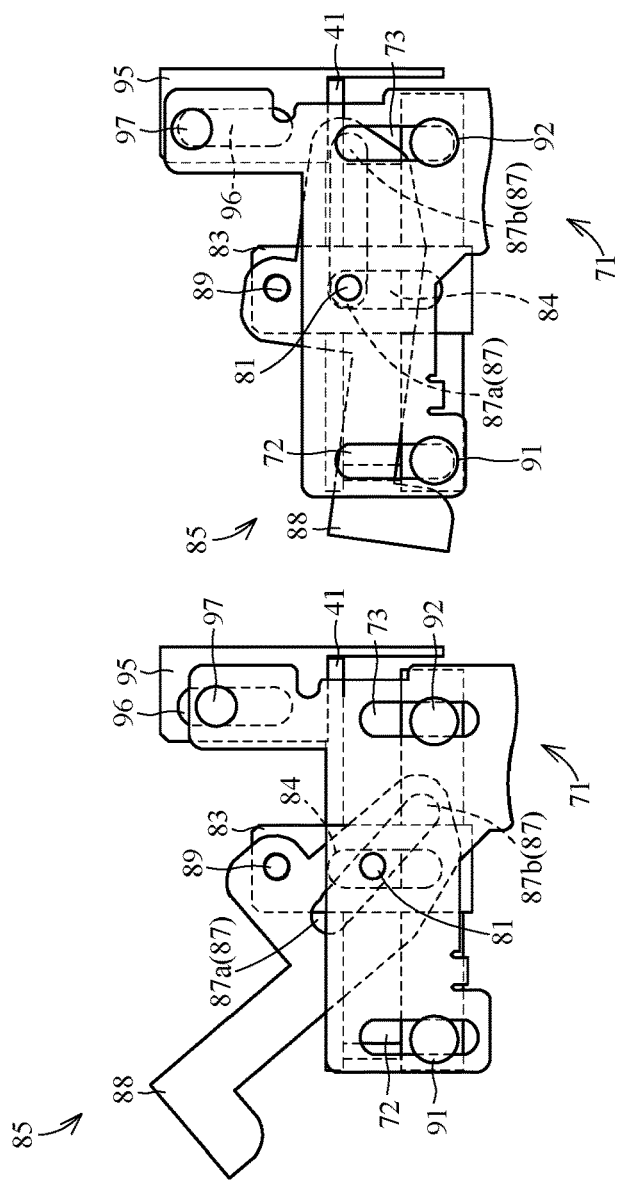
FIG. 12A illustrates movement of the leg relative to the base plate.
FIG. 12B illustrates movement of the leg relative to the base plate.
FIG. 12C illustrates movement of the leg relative to the base plate.

FIGS. 12A, 12B, and 12C each illustrate movement of the leg 71 relative to the base plate 41. FIGS. 12A to 12C are each a side view.

Reference is made to FIG. 12A. The leg 71 is disposed in a lower position.

Reference is made to FIG. 12B. When the user presses down the handle 88, the lever 85 rotates around the lever rotating shaft 89. Then, the pin 81 moves from the second end face 87b to the first end face 87a of the aperture 87 while moving upwardly from a lower portion of the aperture 84. This results in upward movement of the pin 81. The leg 71 moves upwardly integrally with the pin 81.

Reference is made to FIG. 12C. When the user further presses down the handle 88, the lever 85 additionally rotates around the lever rotating shaft 89. Then, the pin 81 moves more upwardly. The leg 71 moves more upwardly integrally with the pin 81. This results in arrival of the leg 71 to an upper position.

In contrast to this, when the user presses up the handle 88, the leg 71 moves downwardly integrally with the pin 81. This causes the leg 71 to move from the upper position to the lower position.

As noted above, the lever 85 causes the pin 81 to move in the substantially vertical direction Z relative to the base plate 41. This causes the leg 71 to move in the substantially vertical direction Z relative to the base plate 41. Moreover, the leg 71 moves upwardly relative to the base plate 41, whereby the filter holder 111 moves toward the joint members 33 to 35, which is to be mentioned later.

Reference is made to FIGS. 3 and 4. The filter coupling device 31 includes a mechanism for keeping a stable movement direction of the leg 71. Specifically, the filter coupling device 31 includes apertures 72 and 73, and pins 91 and 92. The apertures 72 and 73 are formed in the leg 71. The apertures 72 and 73 are each a long hole. The apertures 72 and 73 extend in the substantially vertical direction Z. The pins 91 and 92 are indirectly connected with the base plate 41 (see FIG. 10). The pins 91 and 92 are fixed on the base plate 41. The pins 91 and 92 are arranged in the apertures 72 and 73, respectively. The aperture 72 and the pin 91 are disposed forwardly of the pin 81. The aperture 73 and the pin 92 are disposed rearwardly of the pin 81. The pins 91 and 92 are movable in the substantially vertical direction Z in the apertures 72 and 73, respectively. When the leg 71 moves relative to the base plate 41, the pins 91 and 92 move in the substantially vertical direction Z along the apertures 72 and 73, respectively. In this manner, the pins 91 and 92 and the apertures 72 and 73 keep the movement of the leg 71 in the substantially vertical direction Z.

The filter coupling device 31 further includes a pin guiding unit 95 and a pin 97. The pin guiding unit 95 is connected with the base plate 41 (see FIG. 1 0). The guiding unit 95 is fixed on the base plate 41. The pin guiding unit 95 has an aperture 96. The aperture 96 is a long hole. The aperture 96 extends in the substantially vertical direction Z. The pin 97 is connected with the leg 71. The pin 97 is fixed on the leg 71. The pin 97 is disposed in the aperture 96. The aperture 96 and the pin 97 are disposed rearwardly of the pin 81. The pin 97 is movable in the aperture 96 in the substantially vertical direction Z. When the leg 71 moves relative to the base plate 41, the pin 97 moves in the substantially vertical direction Z along the aperture 96. In this manner, the pin guiding unit 95 and the pin 97 keep the movement of the leg 71 in the substantially vertical direction Z.

3.3. Configuration of Restricting Movement of Leg 71

Reference is made to FIGS. 3 and 4. The filter coupling device 31 includes a leg restricting part 101. The leg restricting part 101 allows prohibition of upward movement of the leg 71 relative to the base plate 41.

Figure 14A:
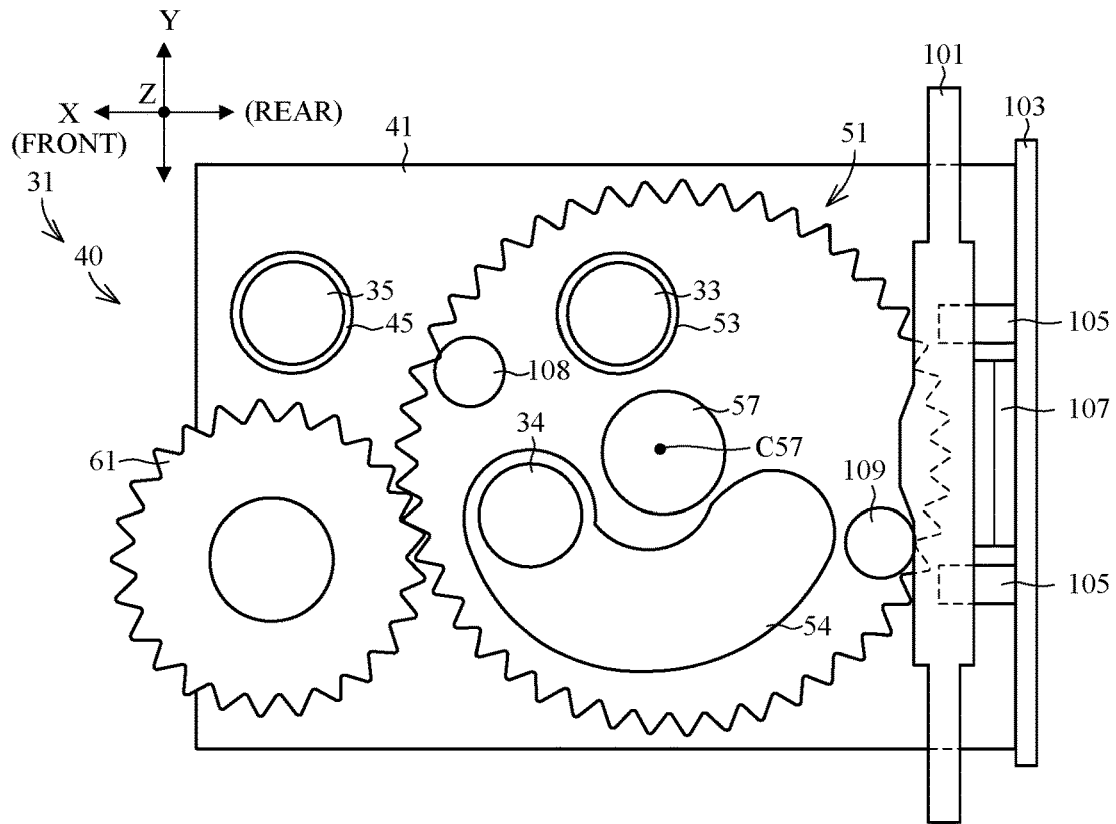
FIG. 14A illustrates a partial bottom view of the filter coupling device.
Figure 14B:
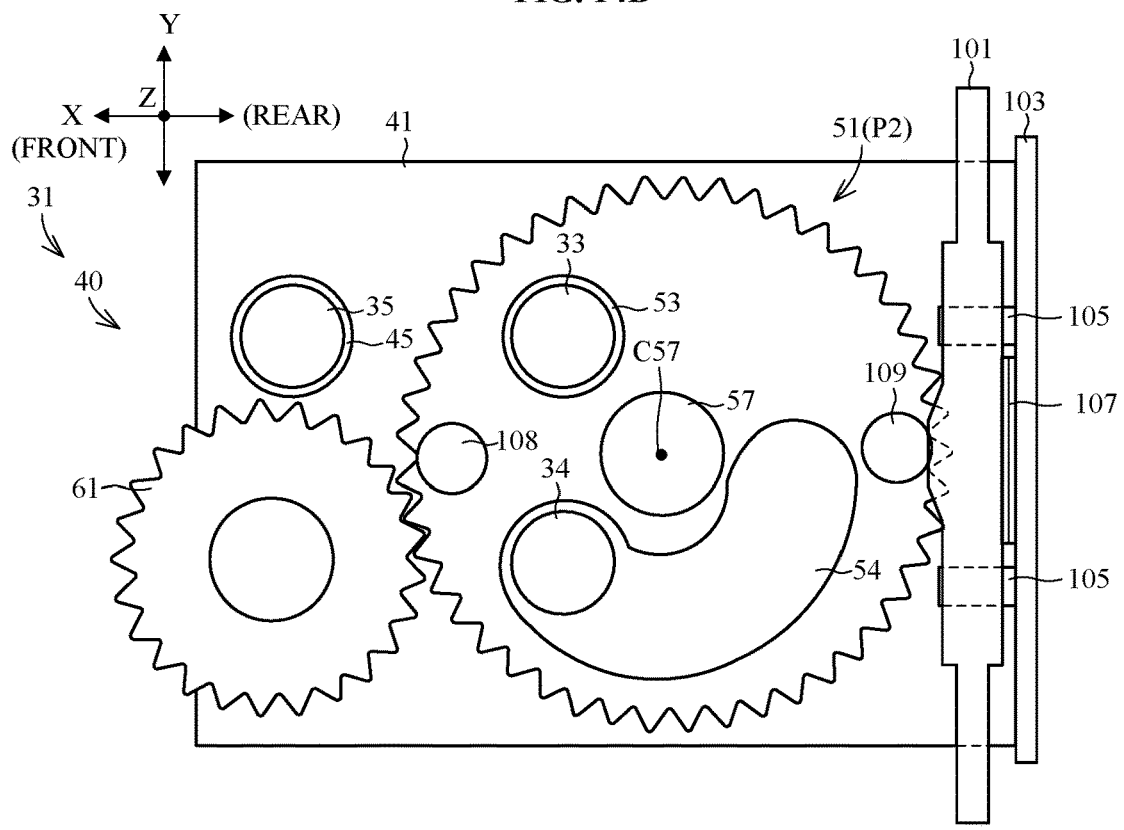
FIG. 14B illustrates a partial bottom view of the filter coupling device.

FIG. 13 is a partially enlarged side view of the filter coupling device 31. FIGS. 14A and 14B are each a partial bottom view of the filter coupling device 31. The leg restricting part 101 is in a substantially linear rod shape. The leg restricting part 101 has a substantially horizontal axis. Specifically, the axis of the leg restricting part 101 is substantially parallel to the width direction Y. The leg restricting part 101 overlaps the moving part 51 when seen from the bottom. Specifically, a part of the leg restricting part 101 overlaps the moving part 51 when seen along the axis C57 of the joint shaft 57.

The leg restricting part 101 is supported on the base plate 41. Specifically, the filter coupling device 31 includes a back plate 103, and guide pins 105. The back plate 103 is connected with the base plate 41. The back plate 103 is fixed on the base plate 41. The guide pins 105 are connected with the back plate 103. The guide pins 105 each have a substantially horizontal axis. Specifically, the axis of each of the guide pins 105 is substantially parallel to the longitudinal direction X. The guide pins 105 extend forwardly from the back plate 103. The guide pins 105 are connected with the leg restricting part 101. The guide pins 105 penetrate the leg restricting part 101. The guide pins 105 support the leg restricting part 101. The guide pins 105 guide the leg restricting part 101 in the longitudinal direction X. This allows the leg restricting part 101 to move in the longitudinal direction X relative to the guide pins 105 (base plate 41). The guide pins 105 keep the movement direction of the leg restricting part 101 in the substantially longitudinal direction X.

The leg restricting part 101 moves in the substantially horizontal direction (specifically, the longitudinal direction X), thereby moving between the prohibitive position and the permissive position. FIG. 13 illustrates the leg restricting part 101 in the permissive position by solid lines. FIG. 13 illustrates the leg restricting part 101 in the prohibitive position by alternate long and short dash lines. FIG. 14A illustrates the leg restricting part 101 in the prohibitive position. FIG. 14B illustrates the leg restricting part 101 in the permissive position. It should be noted that, in FIG. 14A, the moving part 51 is in the position other than the first position P1 and the second position P2. In FIG. 14B, the moving part 51 is in the second position P2.

The prohibitive position is set forwardly of the permissive position. The prohibitive position is equal in level to the permissive position. The leg restricting part 101 moves between the prohibitive position and the permissive position in the substantially longitudinal direction X. Here, the longitudinal direction X corresponds to a radial direction of the joint shaft 57. The radial direction of the joint shaft 57 is orthogonal to the axis C57 of the joint shaft 57.

Reference is made to FIG. 13. The leg 71 has a notch 74. When the leg restricting part 101 is in the prohibitive position, the leg restricting part 101 is disposed in the notch 74. This causes the leg restricting part 101 to prohibit upward movement of the leg 71 when the leg restricting part 101 is in the prohibitive position. Specifically, the leg restricting part 101 contacts the leg 71, thereby prohibiting upward movement of the leg 71 relative to the base plate 41. Accordingly, the leg restricting part 101 prohibits the leg 71 from moving the filter holder 111 toward the joint members 33 to 35. When the leg restricting part 101 is in the permissive position, the leg restricting part 101 is disposed outside of the notch 74. This causes the leg restricting part 101 to permit upward movement of the leg 71 when the leg restricting part 101 is in the permissive position. Specifically, since the leg restricting part 101 does not contact the leg 71, the leg 71 is movable upwardly relative to the base plate 41. This causes the leg restricting part 101 to permit the leg 71 to move the filter holder 111 toward the joint members 33 to 35.

Reference is made to FIGS. 13, 14A, and 14B. The filter coupling device 31 includes an elastic member 107. The elastic member 107 contacts the leg restricting part 101. The elastic member 107 presses the leg restricting part 101 from the permissive position toward the prohibitive position. Specifically, the elastic member 107 presses the leg restricting part 101 forwardly. In other words, the elastic member 107 applies to the leg restricting part 101 an elastic force directed from the permissive position to the prohibitive position. The direction of the elastic force is a forward direction.

The elastic member 107 has a first end face contacting the back plate 103. The first end face of the elastic member 107 is kept in a stable position relative to the base plate 41. The elastic member 107 has a second end face contacting the leg restricting part 101. The second end face of the elastic member 107 moves in accordance with the movement of the leg restricting part 101. The leg restricting part 101 moves while the second end face of the elastic member 107 is kept contacted with the leg restricting part 101. The elastic member 107 presses the leg restricting part 101 forwardly relative to the back plate 103 (base plate 41). The elastic member 107 is, for example, a leaf spring.

Reference is made to FIGS. 14A and 14B. The arrangement switcher 40 has a first contacting part 108 and a second contacting part 109. The first contacting part 108 and the second contacting part 109 are connected with the moving part 51. The first contacting part 108 and the second contacting part 109 are fixed on the moving part 51. The first contacting part 108 and the second contacting part 109 move integrally with the moving part 51.

When the moving part 51 is in the first position P1, the first contacting part 108 contacts the leg restricting part 101 to move the leg restricting part 101 to the permissive position against the elastic force of the elastic member 107. When the moving part 51 is in the first position P1, the second contacting part 109 is positioned away from the leg restricting part 101.

Reference is made to FIG. 14B. When the moving part 51 is in the second position P2, the second contacting part 109 contacts the leg restricting part 101 to move the leg restricting part 101 to the permissive position against the elastic force of the elastic member 107. When the moving part 51 is in the second position P2, the first contacting part 108 is positioned away from the leg restricting part 101.

Reference is made to FIG. 14A. When the moving part 51 is in the position other than the first position P1 and the second position P2, both the first contacting part 108 and the second contacting part 109 are positioned away from the leg restricting part 101. When the moving part 51 is disposed at the position other than the first position P1 and the second position P2, the leg restricting part 101 is disposed at the prohibitive position due to the elastic force of the elastic member 107.

As noted above, when the moving part 51 is disposed at either the first position P1 or the second position P2, the arrangement switcher 40 contacts the leg restricting part 101 and moves the leg restricting part 101 to the permissive position. Consequently, when the moving part 51 is disposed at either first position P1 or the second position P2, the leg restricting part 101 permits upward movement of the leg 71 relative to the base plate 41.

When the moving part 51 is disposed at the position other than first position P1 and the second position P2, the arrangement switcher 40 is positioned away from the leg restricting part 101. When the moving part 51 is disposed at the position other than the first position P1 and the second position P2, the elastic member 107 moves the leg restricting part 101 to the prohibitive position. Consequently, when the moving part 51 is disposed at the position other than the first position P1 and the second position P2, the leg restricting part 101 prohibits upward movement of the leg 71 relative to the base plate 41.

3.4. Configuration of Filter Holder 111

Reference is made to FIGS. 3 and 4. The filter holder 111 supports the filter 21. The filter holder 111 allows support of the first filter 21a and the second filter 21b.

The filter coupling device 31 includes a rotating shaft 121. The rotating shaft 121 is connected with the filter holder 111. The rotating shaft 121 holds the filter holder 111. The rotating shaft 121 has a substantially horizontal axis. Specifically, the axis of the rotating shaft 121 is substantially parallel to the width direction Y.

The leg 71 has an aperture 75. The rotating shaft 121 is disposed in the aperture 75. The leg 71 retains the rotating shaft 121. The leg 71 retains the filter holder 111 via the rotating shaft 121. The filter holder 111 is disposed in the leg 71. In other words, the leg 71 is disposed outwardly from the filter holder 111 in the width direction Y. The filter holder 111 is disposed below the joint members 33 to 35.

The aperture 75 is a long hole. The rotating shaft 121 is movable in the aperture 75. The filter holder 111 is movable integrally with the rotating shaft 121.

Reference is made to FIG. 4. The aperture 75 has a vertical slot 76, a first lateral slot 77a, a second lateral slot 77b, a third lateral slot 77c, a first positioning slot 78a, and a second positioning slot 78b. The vertical slot 76 extends in the substantially vertical direction Z. The vertical slot 76 is connected with the first lateral slot 77a, the second lateral slot 77b, and the third lateral slot 77c. The first lateral slot 77a, the second lateral slot 77b, and the third 3 lateral slot 77c each extend rearwardly from the vertical slot 76. The first lateral slot 77a is disposed below the second lateral slot 77b. The second lateral slot 77b is disposed below the third 3 lateral slot 77c. The first positioning slot 78a is connected with the first lateral slot 77a. The first positioning slot 78a extends downwardly from the first lateral slot 77a. The second positioning slot 78b is connected with the second lateral slot 77b. The second positioning slot 78b extends downwardly from the second lateral slot 77b.

Figure 15C:
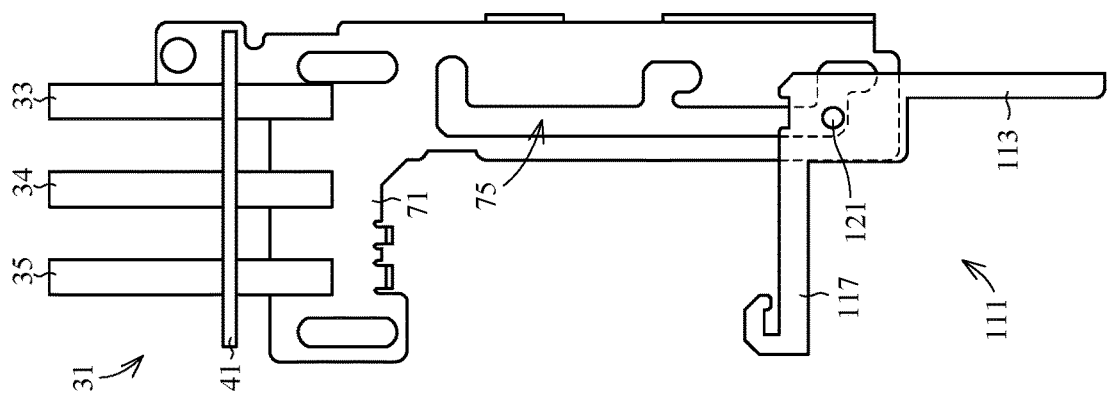
FIG. 15C illustrates rotation of the filter holder.
Figure 15B:
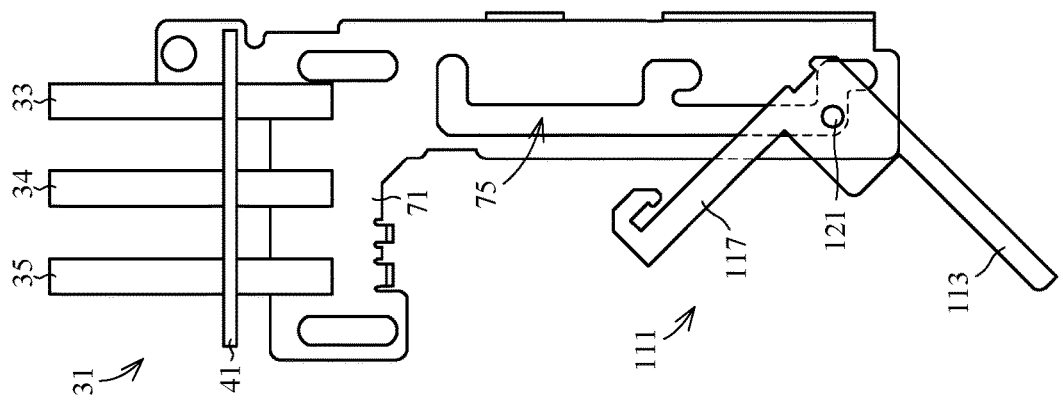
FIG. 15B illustrates rotation of the filter holder.
Figure 15A:
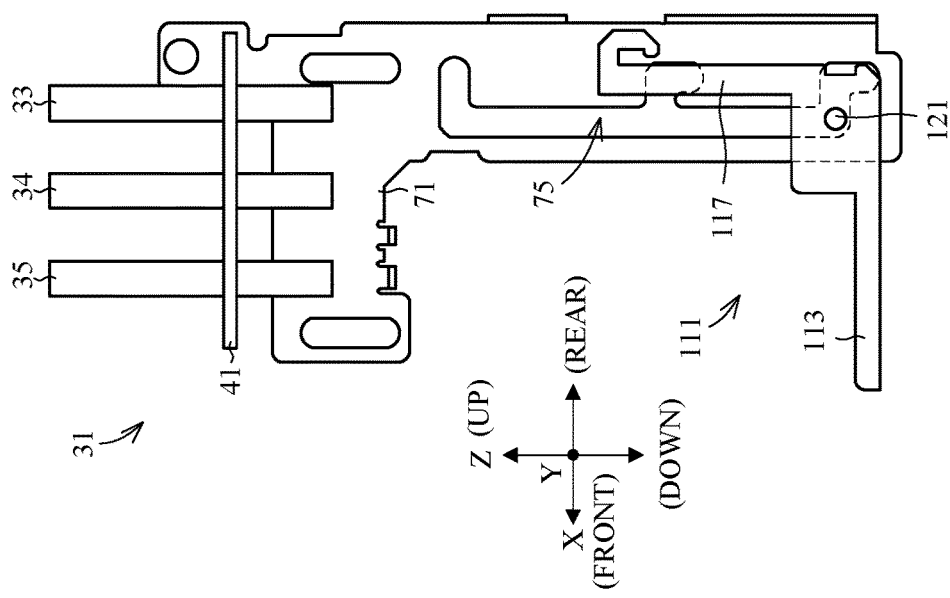
FIG. 15A illustrates rotation of the filter holder.

FIGS. 15A, 15B, and 15C each illustrates operation of rotating the filter holder 111. FIGS. 15A to 15C each illustrate the filter coupling device 31 when seen from the inside of the leg 71. As illustrated, the filter holder 111 is rotatable around the rotating shaft 121. The filter holder 111 is rotatable relative to the leg 71. When rotating around the rotating shaft 121, the filter holder 111 takes a first attitude and a second attitude. FIG. 15A illustrates the filter holder 111 in the first attitude. FIG. 15C illustrates the filter holder 111 in the second attitude.

Figure 16:
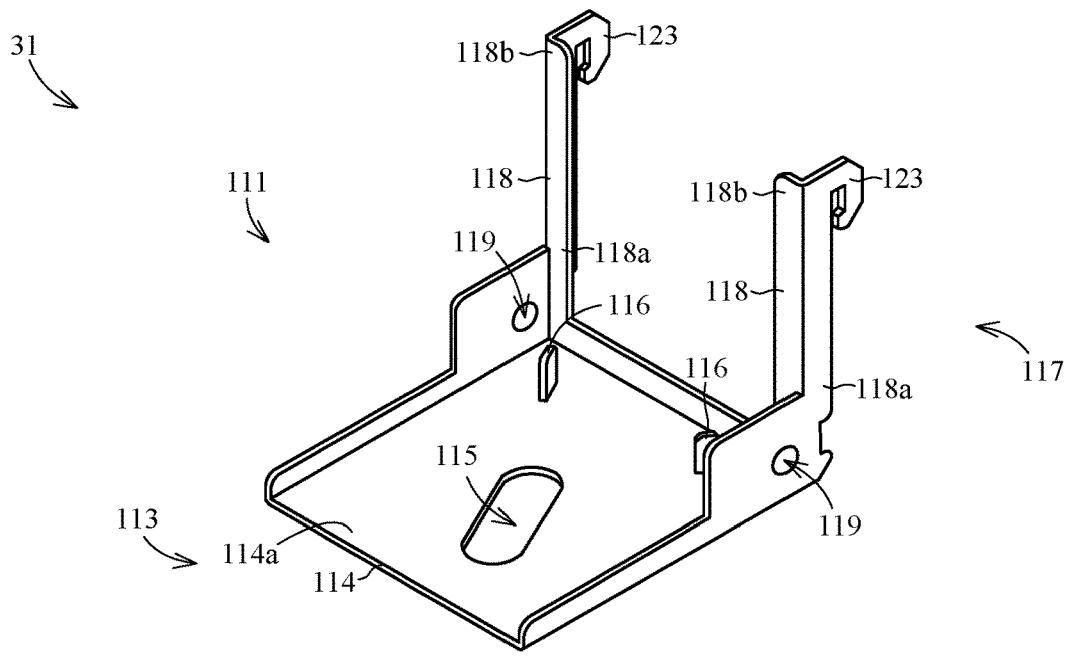
FIG. 16 is a perspective view of the filter holder.
Figure 17:
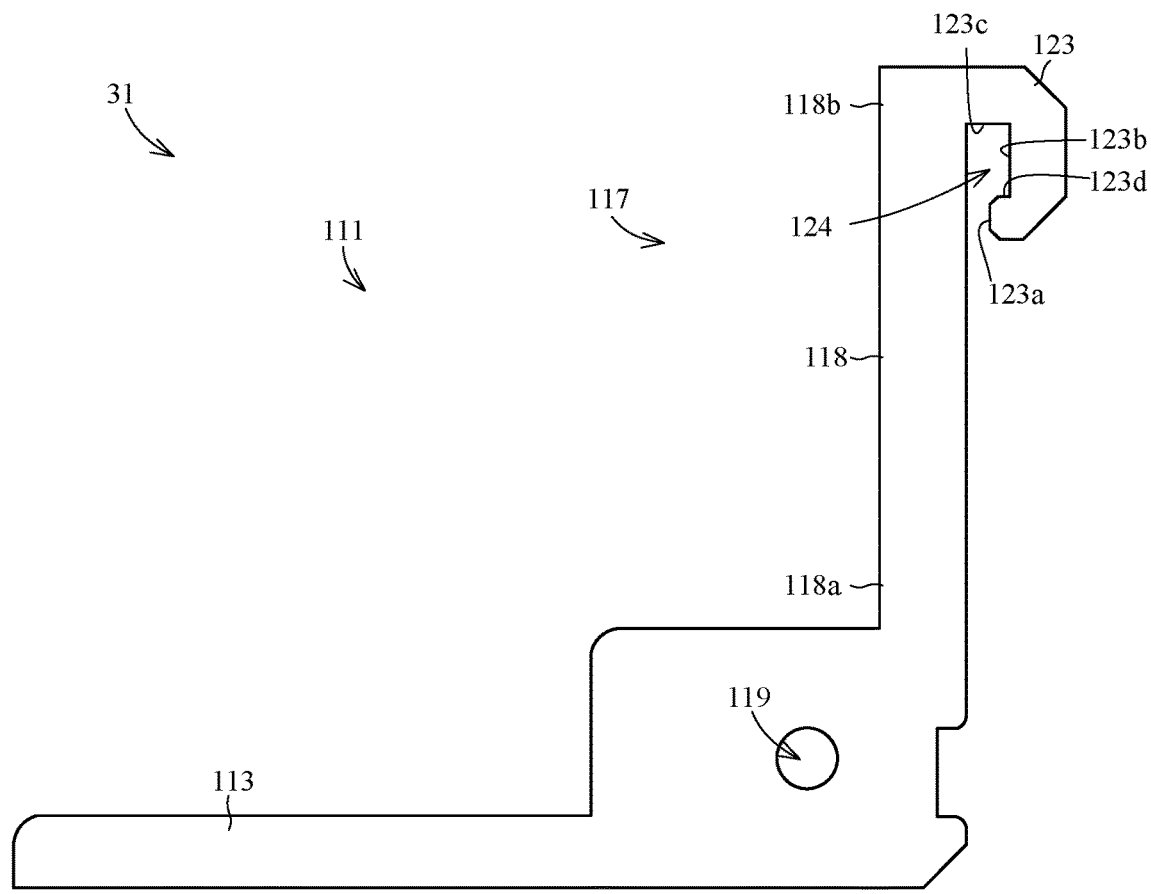
FIG. 17 is a side view of the filter holder.

FIG. 16 is a perspective view of the filter holder 111. FIG. 17 is a side view of the filter holder 111. More strictly speaking, FIG. 17 illustrates the filter holder 111 when seen along the axis of the rotating shaft 121. The filter holder 111 has a first filter holder 113. The first filter holder 113 has a floor 114. The floor 114 has a placement surface 114a. The placement surface 114a is planar. The first filter holder 113 has an aperture 115 and protrusions 116. The aperture 115 is formed in the floor 114. The protrusions 116 project from the floor 114. Specifically, the protrusions 116 project upwardly from the floor 114.

The filter holder 111 has a second filter holder 117. The second filter holder 117 has a pair of holding arms 118. The paired holding arms 118 are spaced away from each other by a gap in the width direction Y. The holding arms 118 are in a narrow plate shape. The holding arms 118 extend linearly. The holding arms 118 are connected with the floor 114. The holding arms 118 each have a proximal end 118a connected with the floor 114. The holding arms 118 extend substantially vertically relative to the placement surface 114a.

The filter holder 111 includes apertures 119. The apertures 119 are disposed adjacent to the proximal ends 118a of the holding arms 118, respectively. The apertures 119 are disposed adjacent to a joining portion between the floor 114 and the holding arms 118. The rotating shaft 121 is disposed in the apertures 119. The rotating shaft 121 is connected with a portion adjacent to the proximal ends 118a of the holding arms 118.

Figure 18:
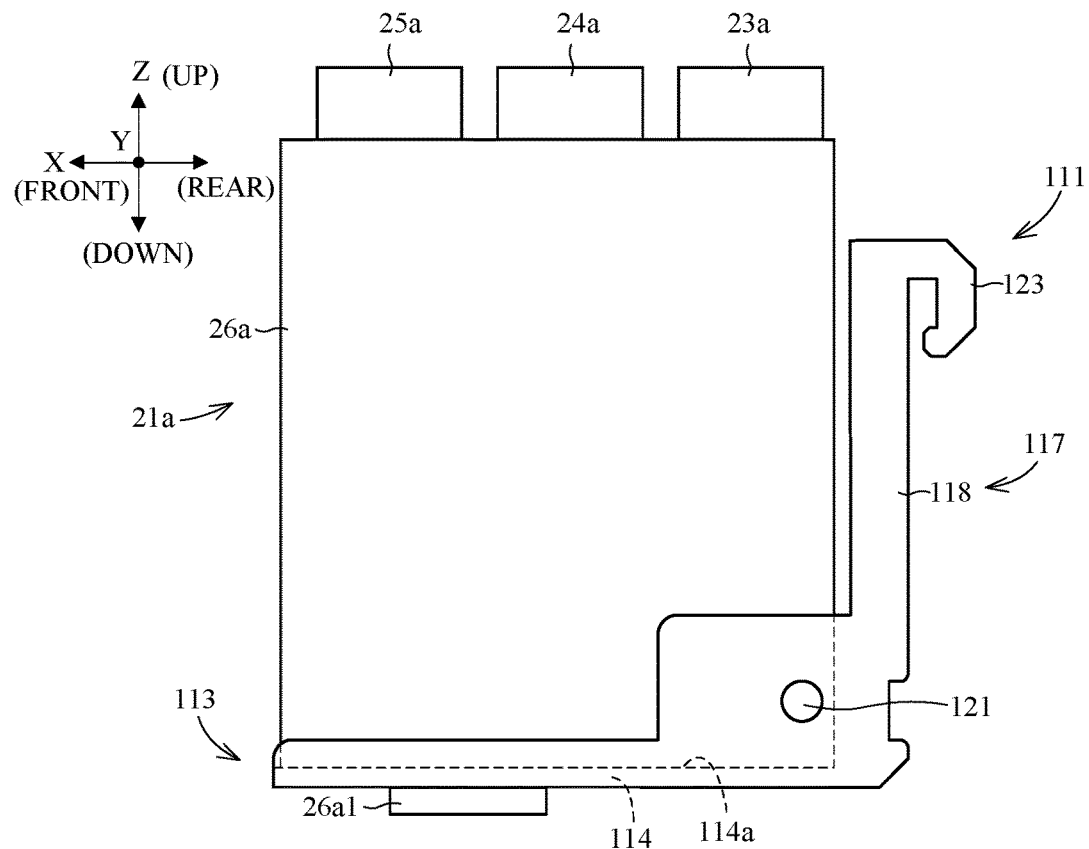
FIG. 18 is a side view of the filter holder and the first filter.

FIG. 18 is a side view of the filter holder 111 and the first filter 21a. The filter holder 111 is in the first attitude. The placement surface 114a is substantially horizontal. The first filter 21a is placed on the placement surface 114a. The placement surface 114a contacts the bottom of the housing 26a of the first filter 21a. In this manner, the floor 114 supports the first filter 21a.

When the housing 26a has a protrusion 26a1 protruding downwardly from the bottom, the protrusion 26a1 is disposed in the aperture 115. This restricts horizontal movement of the first filter 21a relative to the filter holder 111. In addition, this restricts rotation of the first filter 21a relative to the filter holder 111.

The protrusions 116 contact the lateral side of the housing 26a. This restricts horizontal movement of the first filter 21a relative to the filter holder 111. In addition, this restricts rotation of the first filter 21a relative to the filter holder 111.

The holding arms 118 extend upwardly from the floor 114. The holding arms 118 are positioned away from the first filter 21a. Specifically, the holding arms 118 are positioned rearwardly of the first filter 21a.

In this manner, when the filter holder 111 is in the first attitude, the first filter holder 113 contacts the first filter 21a. When the filter holder 111 is in the first attitude, the first filter holder 113 supports the first filter 21a. When the filter holder 111 is in the first attitude, the second filter holder 117 is positioned away from the first filter 21a.

Figure 19:
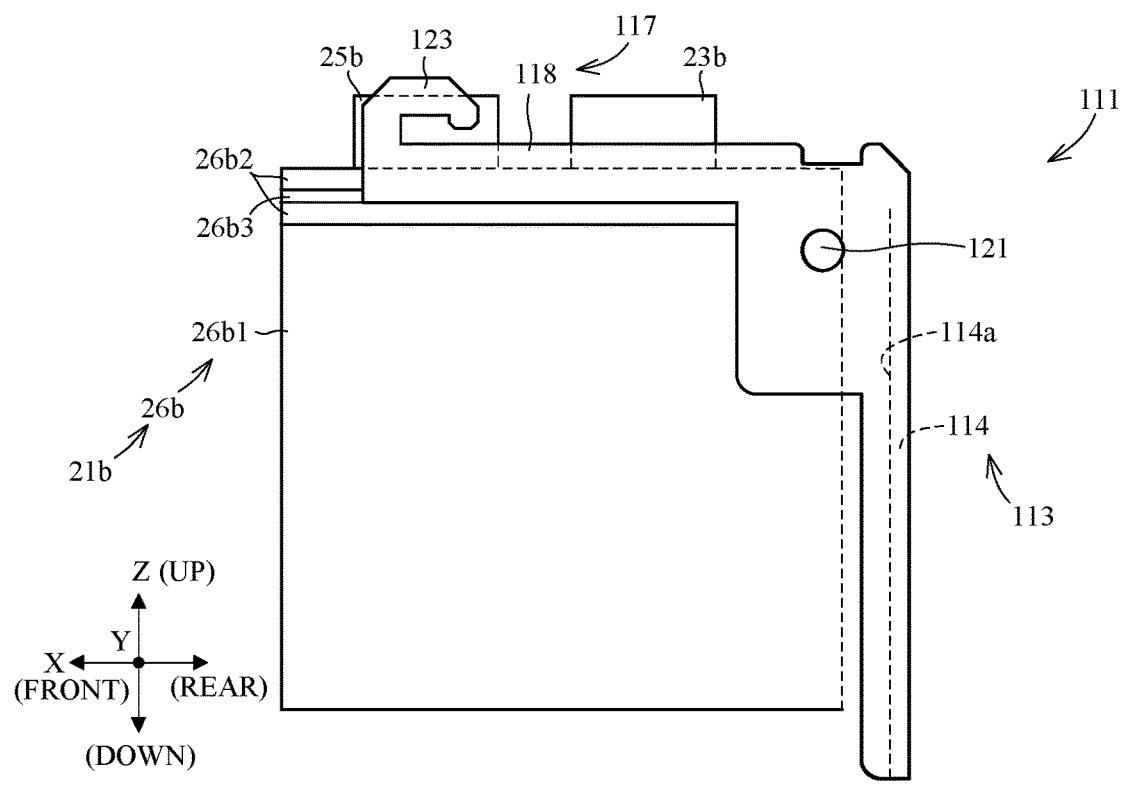
FIG. 19 is a side view of the filter holder and the second filter.

FIG. 19 is a side view of the filter holder and the second filter. The filter holder 111 is in the second attitude. The placement surface 114a is substantially vertical. The floor 114 is positioned away from the second filter 21b. Specifically, the floor 114 is positioned rearwardly of the second filter 21b. The holding arms 118 extend substantially horizontally from the floor 114. Specifically, the holding arms 118 extend forwardly from the floor 114. The holding arms 118 contact a lateral side of the housing 26b of the second filter 21b. Specifically, the holding arms 118 contact the flange portion 26b2 (groove 26b3). This causes the holding arms 118 to holds the second filter 21b. The holding arms 118 restricts movement of the second filter 21b relative to the filter holder 111. In addition, the holding arms 118 restricts rotation of the second filter 21b relative to the filter holder 111.

In this manner, when the filter holder 111 is in the second attitude, the second filter holder 117 contacts the second filter 21b. When the filter holder 111 is in the second attitude, the second filter holder 117 supports the second filter 21b. When the filter holder 111 is in the second attitude n, the first filter holder 113 is positioned away from the second filter 21b.

3.5. Configuration for Holding Filter Holder 111

Reference is made to FIGS. 16 and 17. The filter coupling device 31 includes hooks 123. The hooks 123 are connected with the holding arms 118, respectively. The hooks 123 are connected with portions adjacent to distal ends 118b of the holding arms 118, respectively. The hooks 123 extend from the distal ends 118b to the proximal ends 118a of the holding arms 118. The hooks 123 and the holding arms 118 define a clearances 124 therebetween. When seen the filter holder 111 from the axis direction of the rotating shaft 121, the clearance 124 is visible (see FIG. 17). The clearance 124 is opened.

Specifically, the hooks 123 each have a first face 123a, a second face 123b, a third face 123c, and a forth face 123d. The first face 123a and the second face 123b face to the holding arms 118. The first face 123a and the second face 123b are substantially vertical in the first attitude. The first face 123a and the second face 123b are substantially horizontal in the second attitude. A gap between the first face 123a and the holding arms 118 is smaller than a gap between the second face 123b and the holding arms 118. The third face 123c and the fourth face 123d are connected with the second face 123b. The third face 123c and the fourth face 123d are substantially vertical relative to the second face 123b. The third face 123c and the fourth face 123d face to each other. The third face 123c and the fourth face 123d are substantially horizontal in the first attitude. The third face 123c and the fourth face 123d are substantially vertical in the second attitude. In this manner, the first face 123a, the second face 123b, the third face 123c, and fourth face 123d differ from one another. In other words, one of the first face 123a, the second face 123b, the third face 123c, and the fourth face 123d is not flush with another one of the first face 123a, the second face 123b, the third face 123c, and the fourth face 123d.

Figure 20A:
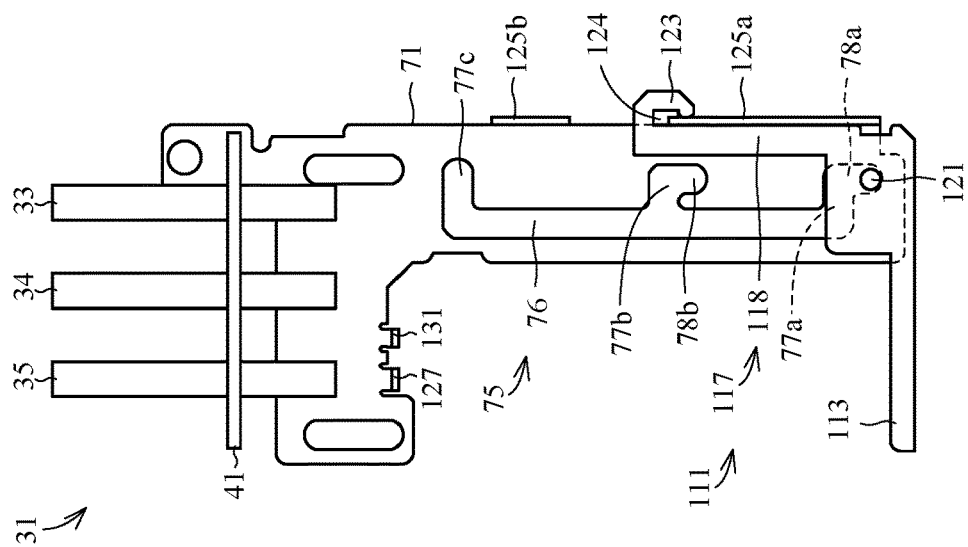
FIG. 20A illustrates a mechanism for keeping the filter holder at a first attitude.
Figure 20B:
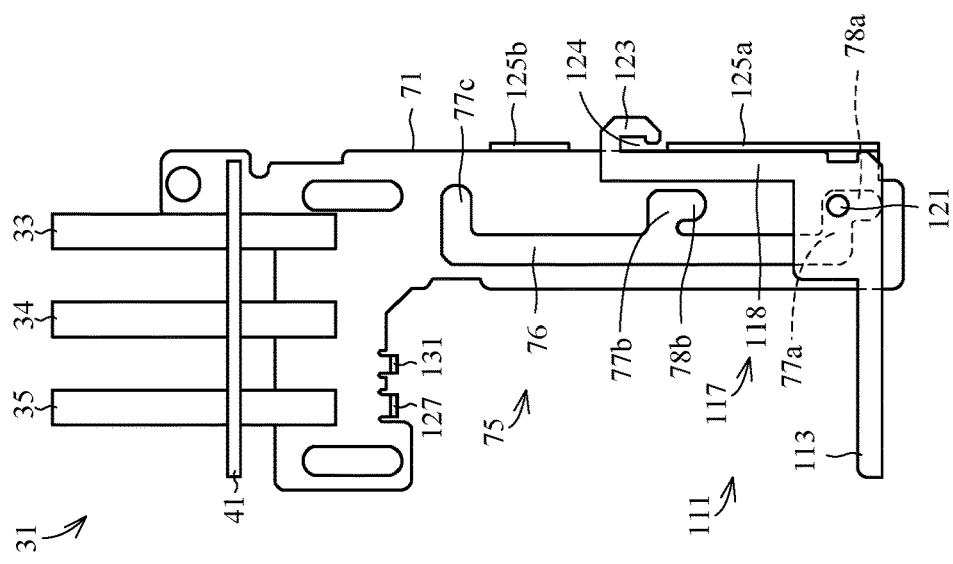
FIG. 20B illustrates a mechanism for keeping the filter holder at a first attitude.
Figure 20C:
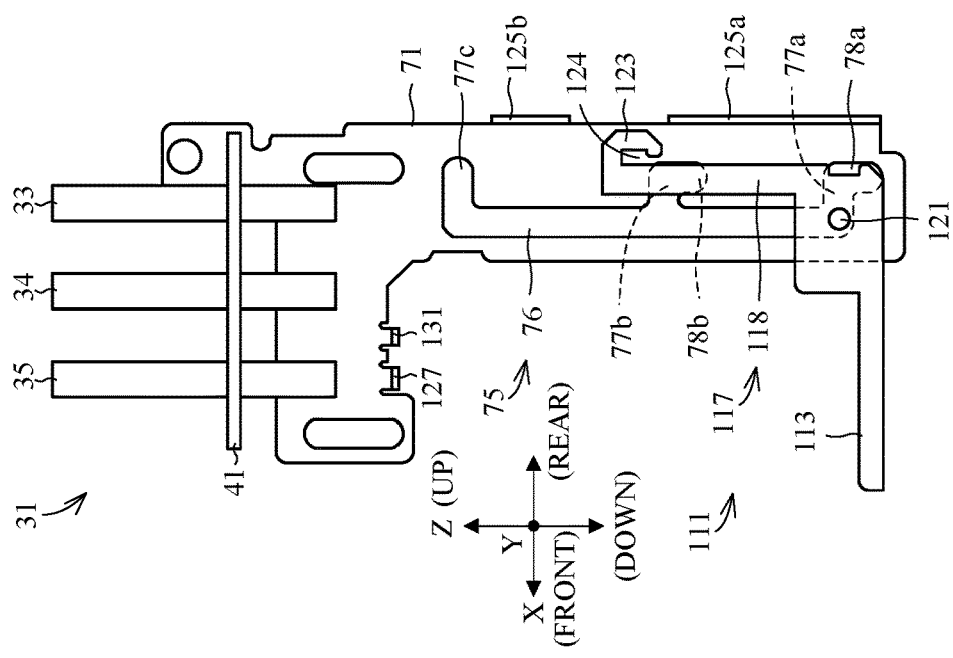
FIG. 20C illustrates a mechanism for keeping the filter holder at a first attitude.

FIGS. 20A, 20B, and 20C each illustrate a mechanism for keeping the filter holder 111 in the first attitude. FIGS. 20A to 20C each illustrate the filter coupling device 31 when seen from the inside of the leg 71. The filter coupling device 31 includes first rotation restricting parts 125a and 125b. The first rotation restricting parts 125a and 125b are connected with the leg 71. The first rotation restricting parts 125a and 125b are fixed on the leg 71. The first rotation restricting parts 125a and 125b are in a substantially vertical plate shape. The first rotation restricting part 125a is disposed below the first rotation restricting part 125b.

Reference is made to FIGS. 20A and 20B. The rotating shaft 121 moves rearwardly in the first lateral slot 77a while the filter holder 111 is in the first attitude. This moves the hooks 123 above the first rotation restricting part 125a.

Reference is made to FIGS. 20B and 20C. The rotating shaft 121 moves downwardly in the first positioning slot 78a while the filter holder 111 is in the first attitude. This disposes an upper end of the first rotation restricting part 125a in the clearance 124. The first rotation restricting part 125a contacts the hooks 123. More specifically, a back face of the first rotation restricting part 125a contacts the first face 123a. This restricts rotation of the filter holder 111 relative to the leg 71 around the rotating shaft 121. That is, the filter holder 111 is kept in the first attitude.

In addition, the first rotation restricting part 125a contacts the holding arms 118. A front face of the first rotation restricting part 125a contacts the holding arms 118. This keeps the filter holder 111 in the first attitude more certainly.

As noted above, when the rotating shaft 121 is positioned in the first positioning slot 78a, the hooks 123 and the first rotation restricting part 125a keep the filter holder 111 in the first attitude. Likewise, when the rotating shaft 121 is positioned in the second positioning slot 78b, the hooks 123 and the first rotation restricting part 125b keep the filter holder 111 in the first attitude.

In addition, when the rotating shaft 121 is positioned in the first positioning slot 78a, the first positioning slot 78a restricts movement of the filter holder 111 relative to the leg 71 in the longitudinal direction X. Likewise, when the rotating shaft 121 is positioned in the second positioning slot 78b, the second positioning slot 78b restricts movement of the filter holder 111 relative to the leg 71 in the longitudinal direction X. In this manner, the first positioning slot 78a and the second positioning slot 78b keep the stable position of the filter holder 111 in the longitudinal direction X.

FIGS. 21A, 21B, and 21C each illustrate a mechanism for keeping the filter holder 111 in the second attitude. FIGS. 21A to 21C each illustrate the filter coupling device 31 when seen from the inside of the leg 71.

The filter coupling device 31 includes a second rotation restricting part 127. The second rotation restricting part 127 is connected with the leg 71. The second rotation restricting part 127 is fixed on the leg 71. The second rotation restricting part 127 is in a protrusive piece shape. The second rotation restricting part 127 protrudes in substantial width direction Y.

Reference is made to FIG. 21A. The rotating shaft 121 moves upwardly in the vertical slot 76 while the filter holder 111 is in the second attitude. This causes the hooks 123 to reach forwardly of the second rotation restricting part 127.

Reference is made to FIGS. 21A and 21B. The rotating shaft 121 moves rearwardly in the third lateral slot 77c while the filter holder 111 is in the second attitude. This position the second rotation restricting part 127 in the clearance 124.

Reference is made to FIGS. 21B and 21C. The rotating shaft 121 moves downwardly in the third lateral slot 77c while the filter holder 111 is in the second attitude. This causes the rotating shaft 121 to contact a lower edge of the third lateral slot 77c. The second rotation restricting part 127 contacts the hooks 123. More specifically, the second rotation restricting part 127 contacts the second face 123b. In other words, the hooks 123 contact an upper portion of the second rotation restricting part 127. This restricts rotation of the filter holder 111 relative to the leg 71 around the rotating shaft 121. In other words, the filter holder 111 is kept in the second attitude.

Moreover, the second rotation restricting part 127 contacts the third face 123c and the fourth face 123d. In other words, the hooks 123 contact a lateral side of the second rotation restricting part 127 (more specifically, front and rear portions). This restricts movement of the filter holder 111 substantially horizontally (more specifically, in the longitudinal direction X).

One of the second face 123b, the third face 123c, and the fourth face 123d is one example of the first face in the present invention. Another one of the second face 123b, the third face 123c, and the fourth face 123d is one example of the second face in the present invention.

In this manner, when the rotating shaft 121 is positioned in the third lateral slot 77c, the hooks 123 and the second rotation restricting part 127 keep the filter holder 111 in the second attitude. In addition, the hooks 123 and the second rotation restricting part 127 keep the stable position of the filter holder 111 in the longitudinal direction X.

3.6. Configuration of Filter Restricting Part

Reference is made to FIGS. 21A, 21B, and 21C. The filter coupling device 31 includes a filter restricting part 131. The filter restricting part 131 is connected with the leg 71. The filter restricting part 131 is fixed on the leg 71. The filter restricting part 131 is in a protrusive piece shape. The filter restricting part 131 protrudes substantially horizontally. The filter restricting part 131 extends above the filter 21 supported by the filter holder 111.

Even if the filter 21 moves upwardly relative to the leg 71, the filter restricting part 131 contacts the filter 21. This causes the filter restricting part 131 to restrict additional upward movement of the filter 21 relative to the leg 71.

3.7. Removable Attachment between Filter Coupling Device 31 and Filter 21

The following describes an operational example of removably attaching the first filter 21a to the filter coupling device 31 and removably attaching the second filter 21b to the filter coupling device 31. The following operational example is typically performed by the user manually.

3.7.1. Coupling First Filter 21a to Filter Coupling Device 31

FIGS. 22A, 22B, and 22C each illustrate a procedure of removably attaching the first filter 21a to the filter coupling device 31.

Reference is made to FIG. 22A. The user operates the filter holder 111 and the rotating shaft 121. This moves the filter holder 111 to the first attitude, positions the rotating shaft 121 in the second positioning slot 78b, and contacts the hooks 123 to the first rotation restricting part 125b. Then, the user places the first filter 21a on the floor 114. This causes the first filter holder 113 to support the first filter 21a.

Reference is made to FIG. 22B. The user operates an operating part 61 (not shown), whereby the joint members 33 to 35 are disposed in the first arrangement. This moves the leg restricting part 101 from the prohibitive position to the permissive position.

Reference is made to FIG. 22C. The user operates the lever 85, whereby the leg 71 moves from the lower position to the upper position. This moves the filter holder 111 and the first filter 21a integrally with the leg 71. The filter holder 111 and the first filter 21a approach the joint members 33 to 35. The connection openings 23a to 25a of the first filter 21a are connected with the joint members 33 to 35, respectively. That is, the filter coupling device 31 is coupled to the first filter 21a.

FIGS. 22A to 22C each illustrate a vertical virtual line L passing through the pin 81. FIGS. 22A to 22C correspond to drawings seen along the axis of the pin 81. Seen along the axis of the pin 81, the virtual line L intersects a center portion of the first filter 21a.

3.7.2. Operation of Detaching First Filter 21a from Filter Coupling Device 31

Reference is made to FIGS. 22C and 22B. The user operates the lever 85, whereby the leg 71 moves downwardly from the upper position. This causes the filter holder 111 to move integrally with the leg 71 downwardly. The connection openings 23a to 25a of the first filter 21a are separated from the joint members 33 to 35, respectively. The first filter 21a moves downwardly while being supported by the filter holder 111. In other words, the filter holder 111 and the first filter 21a move away from the joint members 33 to 35.

Reference is made to FIG. 22B. The leg 71 reaches the lower position. Then, the user removes the first filter 21a from the filter holder 111.

Here, when the leg 71 moves downwardly from the upper position, the connection openings 23a to 25a move away from the joint members 33 to 35, respectively, due to its own weight of the first filter 21a. It should be noted that there may be a case where the connection openings 23a to 25a do not move away from the joint members 33 to 35, respectively, only due to its own weight of the first filter 21a.

FIGS. 23A, 23B, and 23C each illustrate a procedure of removably attaching the first filter 21a to the filter coupling device 31.

Reference is made to FIG. 23A. The leg 71 is disposed in the upper position. The filter 21a is supported by the filter holder 111. The connection openings 23a to 25a are connected with the joint members 33 to 35, respectively.

Reference is made to FIG. 23B. The leg 71 moves downwardly from the upper position. The filter holder 111 moves integrally with the leg 71 downwardly. However, the connection openings 23a to 25a are not separated from the joint members 33 to 35, respectively. The connection openings 23a to 25a are kept connected with the joint members 33 to 35. The filter 21a does not move downwardly. The filter 21a floats upwardly from the filter holder 111. Only the leg 71 and the filter holder 111 move away from the joint members 33 to 35.

Seen from the leg 71, the filter 21a is displaced relative to the leg 71. The filter 21a is displaced upwardly relative to the leg 71. The filter 21a is displaced relative to the leg 71 toward the joint members 33 to 35.

The filter restricting part 131 moves integrally with the leg 71 downwardly. This causes the filter restricting part 131 to contact an upper portion of the first filter 21a. Moreover, the filter restricting part 131 presses the first filter 21a downwardly.

Reference is made to FIG. 23C. The filter restricting part 131 moves the first filter 21a downwardly, thereby separating the connection openings 23a to 25a from the joint members 33 to 35, respectively. That is, the filter restricting part 131 separates the first filter 21a from the filter coupling device 31. Consequently, the filter 21a moves downwardly to be supported by the filter holder 111 again. The filter 21a moves downwardly together with the leg 71 and the filter holder 111. After the leg 71 reaches the lower position, the user removes the first filter 21a from the filter holder 111.

As noted above, even if the connection openings 23a to 25a are not separable from the joint members 33 to 35, respectively, due to its own weight of the first filter 21a only, the filter restricting part 131 allows separation of the connection openings 23a to 25a from the joint members 33 to 35, respectively. That is, the filter restricting part 131 restricts displacement of the first filter 21a relative to the leg 71 toward the joint members 33 to 35.

3.7.3. Operation of Coupling Second Filter 21b to Filter Coupling Device 31

FIGS. 24A, 24B, and 24C each illustrate a procedure of removably attaching the second filter 21b to the filter coupling device 31.

Reference is made to FIG. 24A. The user moves the filter holder 111 and the rotating shaft 121. This moves the filter holder 111 to the second attitude, positions the rotating shaft 121 in the third lateral slot 77c, and contacts the hooks 123 to the second rotation restricting part 127. Then, the user attaches the holding arms 118 to the second filter 21b. This causes the second filter holder 117 to hold the second filter 21b.

Reference is made to FIG. 24B. The user operates an operating part 61 (not shown), whereby the joint members 33 to 35 are disposed in the second arrangement. This moves the leg restricting part 101 from the prohibitive position to the permissive position.

Reference is made to FIG. 24C. The user operates the lever 85, whereby the leg 71 moves from the lower position to the upper position. This causes the filter holder 111 and the second filter 21b to move upwardly together with the leg 71. The filter holder 111 and the second filter 21b move toward the joint members 33 to 35. The filter holder 111 and the second filter 21b approach the joint members 33 to 35. The connection openings 23b to 25b of the second filter 21b are connected with the joint members 33 to 35. That is, the filter coupling device 31 is coupled to the second filter 21b.

FIGS. 24A to 24C each illustrate a vertical virtual line L passing through the pin 81. FIGS. 24A to 24C each correspond to a drawing seen along the axis of the pin 81. Seen along the axis of the pin 81, the virtual line L intersects a center portion of the second filter 21b.

3.7.4. Operation of Detaching Second Filter 21b from Filter Coupling Device 31

Reference is made to FIGS. 24C and 24B. The user operates the lever 85, whereby the leg 71 moves downwardly from the upper position. This causes the filter holder 111 to move downwardly together with the leg 71. The connection openings 23b to 25ab of the first filter 21ab are separated from the joint members 33 to 35, respectively. The first filter 21b moves downwardly while being supported by the filter holder 111. In other words, the filter holder 111 and the first filter 21b move away from the joint members 33 to 35.

Here, since the second filter holder 117 holds the second filter 21b, the second filter 21b is immovable upwardly relative to the filter holder 111. Consequently, when the leg 71 moves downwardly from the upper position, the second filter holder 117 certainly separates the connection openings 23a to 25a from the joint members 33 to 35, respectively.

Reference is made to FIG. 24B. The leg 71 reaches the lower position. Then, the user removes the first filter 21b from the filter holder 111.

3.8. Configuration of First End Face of Joint Member 33, 34, and 35

The first end face 33a of the joint member 33 is substantially same in configuration as the first end faces 34a and 35a of the joint members 34 and 35, respectively. Hereunder, the configuration of the first end faces 33a of the joint member 33 is only described, and description about the configurations of the first end faces 34a and 35a of the joint members 34 and 35, respectively, is to be omitted.

Figure 25A:
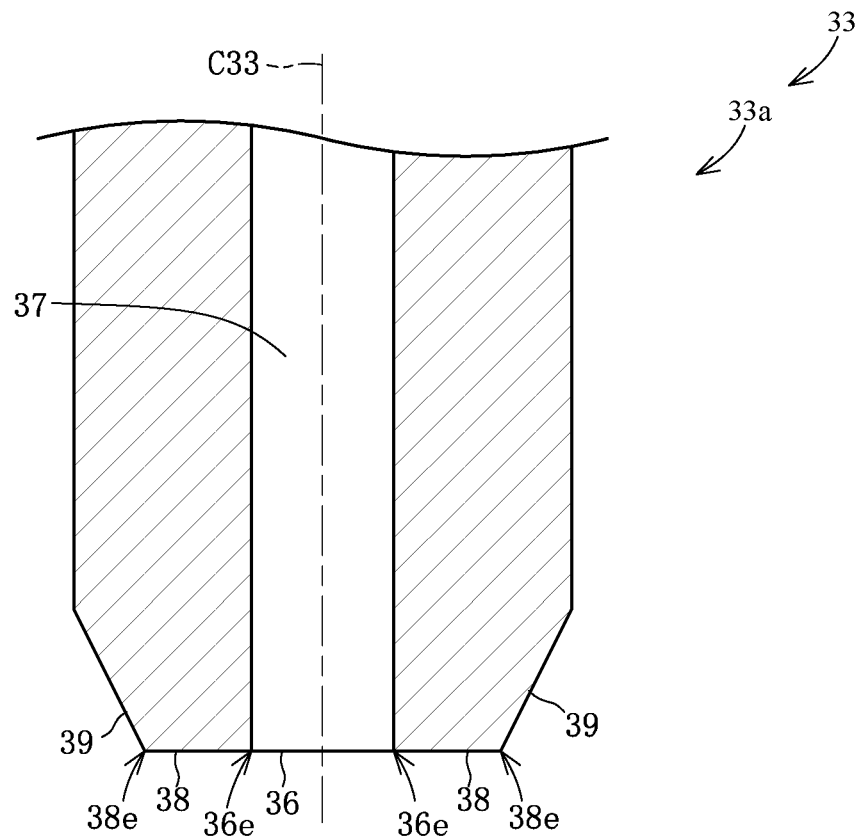
FIG. 25A is an enlarged sectional view of a first end face of one of the joint members.
Figure 25B:
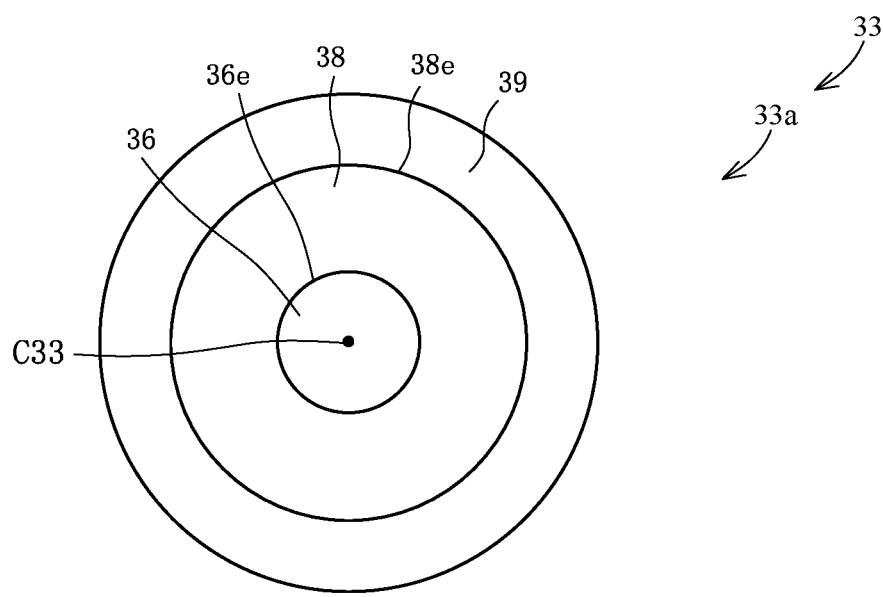
FIG. 25B is an enlarged plan view of the first end face of the joint member.

FIG. 25A is an enlarged sectional view of the first end face 33a of the joint member 33. FIG. 25B is an enlarged plan view of the first end face 33a of the joint member 33. FIG. 25B illustrates the first end face 33a of the joint member 33 when seen along the axis C33 of the joint member 33. The joint member 33 includes an aperture 36 and a flow path 37. The aperture 36 is formed in the first end face 33a. The aperture 36 is substantially circular. The aperture 36 is in communication with the flow path 37. The flow path 37 is formed in an interior of the joint member 33. A treating liquid flows through the aperture 36 and the flow path 37.

The joint member 33 has a planar end face 38. The planar end face 38 is formed surrounding the aperture 36. The planar end face 38 contacts an outer peripheral edge 36e of the aperture 36. The planar end face 38 extends outwardly from the outer peripheral edge 36e of the aperture 36. More specifically, the planar end face 38 extends outwardly in a radial direction from the axis C33 of the joint member 33. The planar end face 38 is a flat plane. The planar end face 38 is substantially parallel to a plane orthogonal to the axis C33 of the joint member 33. The planar end face 38 has an annular shape when seen along the axis C33 of the joint member 33.

The joint member 33 has a sloped peripheral face 39. The sloped peripheral face 39 is formed surrounding the planar end face 38. The sloped peripheral face 39 contacts an outer peripheral edge 38e of the planar end face 38. The sloped peripheral face 39 extends from the outer peripheral edge 38e of the planar end face 38 toward the second end face 33b of the joint member 33. The sloped peripheral face 39 is inclined outwardly in the radial direction toward the second end face 33b of the joint member 33. In other words, the sloped peripheral face 39 is tapered toward the planar end face 38. The sloped peripheral face 39 has an annular shape when seen along the axis C33 of the joint member 33.

Figure 26:
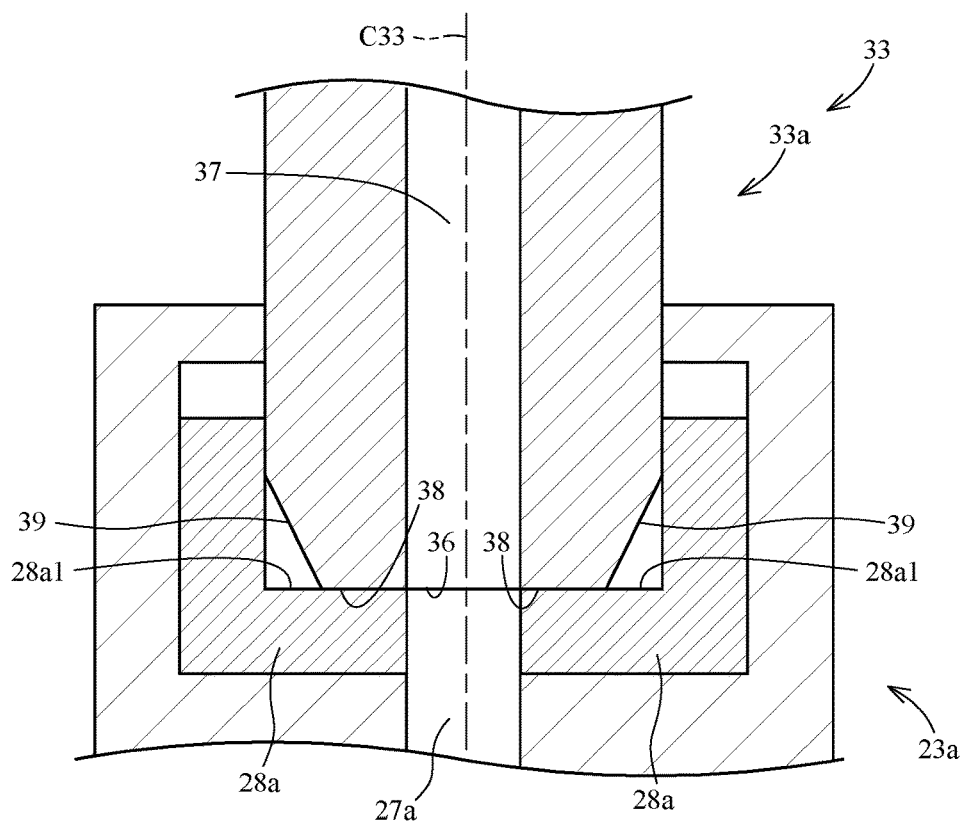
FIG. 26 is a sectional view illustrating connection between the joint members and connection openings.

FIG. 26 is a sectional view illustrating connection between the joint member 33 and the connection opening 23a. The connection opening 23a of the first filter 21a has a flow path 27a and a sealing member 28a. The sealing member 28a is disposed surrounding the flow path 27a. The sealing member 28a has a flat plane 28a1.

Face contact is performed between the planar end face 38 of the first end face 33a and the plane 28a1. The contact of the planar end face 38 with the plane 28a1 achieves face sealing. Consequently, the joint member 33 is suitably connectable with the connection opening 23a.

Figure 27:
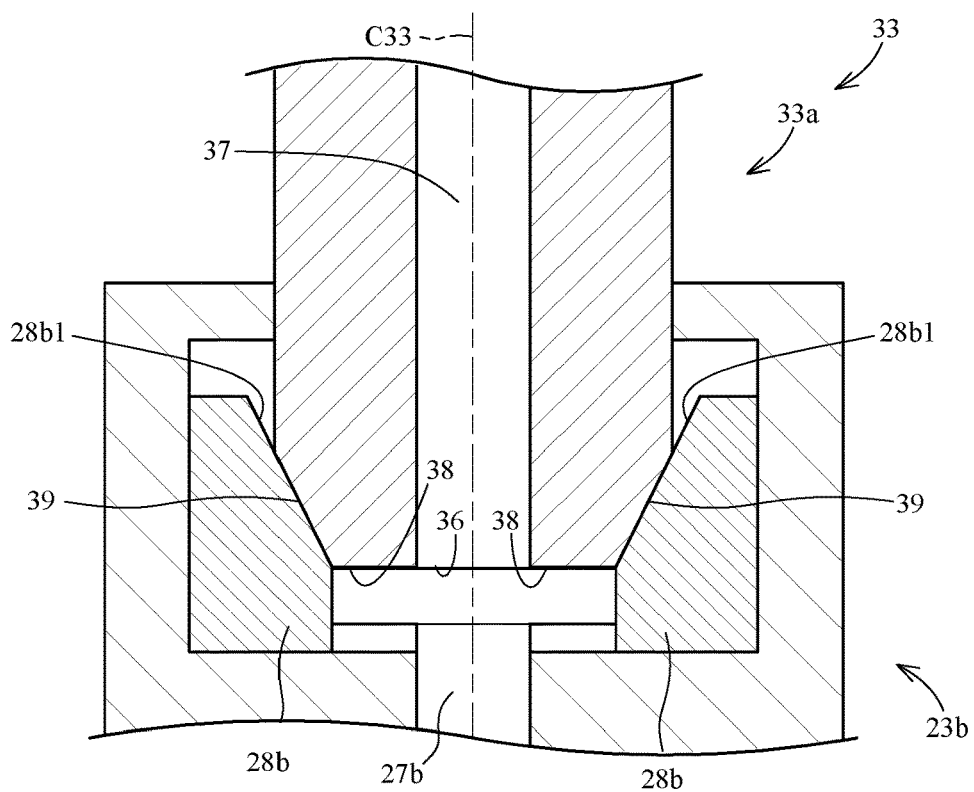
FIG. 27 is a sectional view illustrating connection between the joint members and connection openings.

FIG. 27 is a sectional view illustrating connection between the joint member 33 and the connection opening 23b. The connection opening 23b of the second filter 21b has a flow path 27b and a sealing member 28b. The sealing member 28b is disposed surrounding the flow path 27b. The sealing member 28b has a sloped face 28b1 that is inclined.

Face contact is performed between the sloped peripheral face 39 of the first end face 33a and the sloped face 28b1. The contact of the sloped peripheral face 39 with the sloped face 28b1 achieves face sealing. Consequently, the joint member 33 is suitably connectable with the connection opening 23b.

4. Effect of Present Embodiment

The filter coupling device 31 includes the filter holder 111, the rotating shaft 121, and the leg 71. This allows suitable rotation of the filter holder 111. The filter holder 111 is able to take both the first attitude and the second attitude.

The filter holder 111 includes the first filter holder 113, and the second filter holder 117. When the filter holder 111 is in the first attitude, the first filter holder 113 supports the first filter 21a. When the filter holder 111 is in the second attitude, the second filter holder 117 supports the second filter 21b. This allows the filter holder 111 to support the first filter 21a and the second filter 21b suitably.

As noted above, the filter coupling device 31 is connectable with two or more types of filters 21 suitably with different shapes individually. This facilitates replacement among two or more types of filters 21 with different shapes.

When the filter holder 111 is in the first attitude, the first filter holder 113 contacts the housing 26b of the first filter 21a. Consequently, the first filter holder 113 allows suitable support of the first filter 21a. When the filter holder 111 is in the first attitude, the second filter holder 117 does not contact the first filter 21a. Consequently, the first filter holder 113 allows more suitable support of the first filter 21a.

Likewise, when the filter holder 111 is in the second attitude, the second filter holder 117 contacts the housing 26b of the second filter 21b. Consequently, the second filter holder 117 allows suitable support of the second filter 21b. When the filter holder 111 is in the second attitude, the first filter holder 113 does not contact the second filter 21b. Consequently, the second filter holder 117 allows more suitable support of the second filter 21b.

The first filter holder 113 includes the floor 114. The floor 114 has the placement surface 114a. This allows the first filter holder 113 to support the first filter 21a suitably. In addition, the second filter holder 117 includes the holding arm 118. This allows the second filter holder 117 to support the second filter 21b suitably.

The holding arm 118 extends substantially perpendicularly relative to the placement surface 114a. Accordingly, rotation by approximately 90 degrees of the filter holder 111 causes variation in attitude of the filter holder 111 between the first attitude and the second attitude. In this manner, the filter holder 111 achieves its first and second attitudes by a relatively small amount of rotation.

The filter holder 111 is disposed below the joint members 33 to 35. This allows the filter holder 111 to support the first filter 21a and the second filter 21b below the joint members 33 to 35.

When the filter holder 111 is in the first attitude, the placement surface 114a is positioned substantially horizontally. This allows the first filter holder 113 to support the first filter 21a suitably.

When the filter holder 111 is in the first attitude, the holding arm 118 extends in the substantially vertical direction Z. This allows the second filter holder 117 to retract to a position away from the first filter 21a suitably.

When the filter holder 111 is in the second attitude, the placement surface 114a is substantially vertical. This allows the first filter holder 113 to retract to a position away from the second filter 21b suitably.

When the filter holder 111 is in the second attitude, the holding arm 118 extends from the floor substantially horizontally. This allows the second filter holder 117 to support the second filter 21b suitably.

When the filter holder 111 is in the first attitude, the first rotation restricting parts 125a and 125b contact the hooks 123. This restricts rotation of the filter holder 111. Consequently, the filter holder 111 is suitably kept in the first attitude.

When the filter holder 111 is in the first attitude, the first rotation restricting parts 125a and 125b contact the holding arms 118. This restricts rotation of the filter holder 111 more suitably. Consequently, the filter holder 111 is suitably kept in the first attitude.

When the filter holder 111 is in the second attitude, the second rotation restricting part 127 contacts the hooks 123. This restricts rotation of the filter holder 111 suitably. Consequently, the filter holder 111 is suitably kept in the second attitude.

When the filter holder 111 is in the second attitude, the hooks 123 contact the lateral side of the second rotation restricting part 127. This suitably restricts horizontal movement of the filter holder 111. Consequently, the position of the filter holder 111 is kept stable when the filter holder 111 is in the second attitude.

When the filter holder 111 is in the second attitude, the second rotation restricting part 127 contacts the second face 123b, the third face 123c, and the fourth face 123d of the hooks 123. It should be noted that the second face 123b, the third face 123c, and the fourth face 123d differ from one another. Specifically, the second face 123b is not flush with the third face 123c. The second face 123b is not flush with the fourth face 123d. The third face 123c is not flush with the fourth face 123d. Consequently, when the filter holder 111 is in the second attitude, the position of the filter holder 111 is maintained stable.

The rotating shaft 121 is connected with the proximal end faces 118a of the holding arms 118, and the hooks 123 are connected with the distal end faces 118b of the holding arms 118. This relatively increases a distance between the rotating shaft 121 and the hooks 123. Consequently, the hooks 123 restricts rotation of the filter holder 111 around the rotating shaft 121 more suitably.

The leg 71 is movable relative to the base plate 41. Consequently, the leg 71 allows the filter holder 111 to approach the joint members 33 to 35 easily. In addition, the leg 71 allows the filter holder 111 to move away from the joint members 33 to 35 easily.

The filter coupling device 31 includes the arrangement switcher 40. This allows a plurality of joint members 33 to 35 to be disposed in the first arrangement and the second arrangement.

When the joint members 33 to 35 are disposed in the first arrangement, the joint members 33 to 35 are suitably connectable with the connection openings 23 to 25 of the first filter 21a, respectively, and the filter coupling device 31 is able to be coupled with the first filter 21a suitably.

When the joint members 33 to 35 are disposed in the second arrangement, the joint members 33 to 35 are suitably connectable with the connection openings 23 to 25 of the second filter 21b, respectively, and the filter coupling device 31 is able to be coupled with the second filter 21b suitably.

As noted above, the filter coupling device 31 allows suitable coupling between the first filter 21a and the second filter 21b with the different arrangements of the connection openings 23 to 25. This results in easy replacement of the first filter 21a with the second filter 21b and vice versa.

The filter holder 111 is able to support the first filter 21a and the second filter 21b. The leg 71 moves the filter holder 111 so as for the filter holder 111 to approach the joint members 33 to 35. The filter holder 111 and the leg 71 allow suitable connection of the connection openings 23 to 25 of the filter 21 supported by the filter holder 111 with the joint members 33 to 35.

When the joint members 33 to 35 is disposed in either the first arrangement or the second arrangement, the leg restricting part 101 is located at the permissive position, and the leg restricting part 101 permits connection between the connection openings 23 to 25 and the joint members 33 to 35, respectively. This causes the leg restricting part 101 to permit appropriate connection. Here, the appropriate connection means that the connection openings 23 to 25 are connected with the joint members 33 to 35, respectively, that are disposed in either the first arrangement or the second arrangement.

In other than the first and second arrangements, the leg restricting part 101 is located at the prohibitive position to restrict connection between the connection openings 23 to 25 and the joint members 33 to 35, respectively. Consequently, the leg restricting part 101 prohibits wrong connection in advance. It should be noted that the wrong connection means that the connection openings 23 to 25 are connected with the joint members 33 to 35 located in the arrangement other than first arrangement and the second arrangement.

When the arrangement of the joint members 33 to 35 is either the first arrangement or the second arrangement, the arrangement switcher 40 positions the leg restricting part 101 at the permissive position against the elastic force of the elastic member 107. When the joint members 33 to 35 are located in the arrangement other than the first arrangement and the second arrangement, the arrangement switcher 40 is positioned away from the leg restricting part 101, and the elastic member 107 moves the leg restricting part 101 to the prohibitive position. As noted above, the elastic member 107 and the arrangement switcher 40 allow the leg restricting part 101 to move between the permissive position and the prohibitive position suitably.

The moving part 51 moves the joint members 33 and 34. When the moving part 51 is in the first position P1, the moving part 51 positions the joint members 33 to 35 in the first arrangement. When the moving part 51 is in the second position P2, the moving part 51 positions the joint members 33 to 35 in the second arrangement. As noted above, the moving part 51 allows suitable switch the arrangement of the joint members 33 to 35 between the first arrangement and the second arrangement.

When the moving part 51 is in the first position P1, the first contacting part 108 positions the leg restricting part 101 to the permissive position. Consequently, when the joint members 33 to 35 are disposed in the first arrangement, the first contacting part 108 allows positioning of the leg restricting part 101 to the permissive position suitably.

When the moving part 51 is in the second position P2, the second contacting part 109 positions the leg restricting part 101 to the permissive position. Consequently, when the joint members 33 to 35 are disposed in the second arrangement, the second contacting part 109 allows positioning of the leg restricting part 101 to the permissive position suitably.

When the moving part 51 is in the position other than the first position P1 and the second position P2, the first contacting part 108 and the second contacting part 109 are positioned away from the leg restricting part 101. Consequently, when the joint members 33 to 35 are disposed in the arrangement other than the first arrangement and the second arrangement, the first contacting part 108 and the second contacting part 109 suitably permit location of the leg restricting part 101 at the prohibitive position.

Since the arrangement switcher 40 includes the joint shaft 57, the moving part 51 is rotatable relative to the base plate 41 suitably. Consequently, the moving part 51 allows suitable switching of the arrangement of the joint members 33 to 35 between the first arrangement and the second arrangement.

The leg restricting part 101 moves between the prohibitive position and the permissive position in the radial direction of the joint shaft 57. Consequently, the first contacting part 108 and the second contacting part 109 allow the leg restricting part 101 to move from the prohibitive position to the permissive position suitably.

The leg restricting part 101 overlaps the moving part 51 when seen along the axis C57 of the joint shaft 57. This causes the first contacting part 108 and the second contacting part 109 to contact the leg restricting part 101 easily.

The filter holder 111 is disposed below the joint members 33 to 35, and the leg 71 is movable upwardly relative to the base plate 41. Consequently, this allows the filter holder 111 to approach the joint members 33 to 35 suitably.

The axis C57 of the joint shaft 57 is substantially vertical. Accordingly, the moving part 51 allows the joint members 33 to 35 to move substantially horizontally easily.

The leg 71 moves in the substantially vertical direction Z, and the leg restricting part 101 moves in the substantially horizontal direction. As above, the leg restricting part 101 moves in the direction substantially perpendicular to the direction where the leg 71 moves. Consequently, the permissive position and the prohibitive position are able to be set close to each other. This allows the leg restricting part 101 to move between the permissive position and the prohibitive position easily.

The leg 71 is retained by the arrangement switcher 40, and accordingly, the leg 71 allows the filter holder 111 to move toward the joint members 33 to 35 suitably.

The filter restricting part 131 is contactable with the filter 21 supported by the filter holder 111. The filter restricting part 131 restricts displacement of the filter 21 to the joint members 33 to 35 relative to the leg 71. In other words, the filter restricting part 131 restricts movement of the filter 21 toward the leg 71 while approaching the joint members 33 to 35. Consequently, the filter restricting part 131 allows the connection openings 23 to 25 of the filter 21 to be separated from the joint members 33 to 35 suitably.

The joint members 33 to 35 each have the planar end face 38 and the sloped peripheral face 39. Consequently, the joint members 33 to 35 allow suitable connection with the connection openings 23a to 25a and the connection openings 23b to 25b having different configurations.

Since the filter coupling device 31 includes the pin 81 and the lever 85, the leg 71 is movable relative to the base plate 41 easily.

The vertical virtual line L, passing through the pin 81 when seen along the axis of the pin 81, intersects the center portion of the filter 21 supported by the filter holder 111. Consequently, the pin 81 and the lever 82 allow the entire leg 71 and filter holder 111 to move in the substantially vertical direction Z on good balance. This achieves movement of the entire filter 21 in good balance. Specifically, upward movement of the filter 21 is avoidable under a condition where the filter 21 is inclined. Here, the condition where the filter 21 is inclined is, for example, a condition where a front portion of the filter 21 is lower in level than a rear portion of the filter 21. As a result, all the connection openings 23 to 25 are connectable suitably with the joint members 33 to 35, respectively.

The substrate treating apparatus 1 includes the filter coupling device 31 mentioned above. Consequently, the filter 21 is easily selectable and replaceable in accordance with the types of the substrate W, the types of the treating liquid, and the types of the treatment. This achieves appropriate filtering of the treating liquid. As a result, a processing quality of the substrate treatment is further enhanced.

The present invention is not limited to the foregoing examples, but may be modified as follows.

(1) In the embodiment mentioned above, the joint members 33 to 35 are connected with the connection openings 23 to 25 of the filter 21, respectively. However, this is not limitative. For instance, the first end of the primary side piping 11a and the first end of the secondary side piping 11b may be connected with the connection openings 23 and 24 directly. Specifically, the filter coupling device 31 may include the arrangement switcher 40 (base plate 41) configured to support the first end of the primary side piping 11a and the first end of the secondary side piping 11b. In this modification, the first end of the primary side piping 11a and the first end of the secondary side piping 11b are one example of the connection ports in the present invention.

(2) The embodiment mentioned above includes no power source configured to drive the moving part 51. However, this is not limitative. That is, the arrangement switcher 40 may include a power source configured to drive the moving part 51.

(3) In the embodiment mentioned above, provided are two arrangements (specifically first arrangement and the second arrangement) of the joint members 33 to 35 that the arrangement switcher 40 is able to switch. However, this is not limitative. For instance, the number of arrangements that the arrangement switcher is able to switch is variable to three or more. In other words, the arrangement switcher may switch the three or more arrangement of the joint members 33 to 35.

(4) In the embodiment mentioned above, two of the joint members 33 to 35 are moved by the moving part 51. However, this is not limitative. For instance, one or three of the joint members 33 to 35 may be moved by the moving part 51.

(5) In the embodiment mentioned above, the first filter holder 113 supports the filter 21 by placing the filter 21. However, this is not limitative. The first filter holder 113 may support the filter 21 by grasping the filter 21.

(6) In the embodiment mentioned above, the arrangement of the connection openings 23 to 25 of the filter 21 is illustrated. However, this is not limitative. The arrangement of connection openings 23 to 25 of the filter 21 is variable appropriately. The shape of the filter 21 and the configuration of the connection openings 23 to 25 are also variable in the same manner.

(7) In the embodiment mentioned above, three connection openings of the first filter 21a are provided. However, this is not limitative. Alternatively, two connection openings or four or more connection openings of the first filter 21a may be provided. Likewise, the number of the connection openings of the second filter 21b is variable appropriately. The number of the joint members 33 to 35 of the filter coupling device 31 is variable in accordance with variation in number of the connection openings.

(8) In the embodiment mentioned above, the virtual line L seen along the axis of the pin 81 intersects the center portion of the first filter 21a and the center portion of the second filter 21b supported by the filter holder 111. However, this is not limitative. The virtual line L seen along the axis of the pin 81 may intersect either the center portion of the first filter 21a or the center portion of the second filter 21b supported by the filter holder 111.

(9) In the embodiment mentioned above, when the filter holder 111 is in the second attitude, the second rotation restricting part 127 contacts the three faces of the hooks 123 (i.e., the second face 123b, the third face 123c, and the fourth face 123d). However, this is not limitative. For instance, when the filter holder 111 is in the second attitude, the second rotation restricting part 127 may contact two faces selected from the second face 123b, the third face 123c, and the fourth face 123d. For instance, when the filter holder 111 is in the second attitude, the second rotation restricting part 127 may contact four or more faces of the hooks 123. Such modifications also achieve the stably kept position of the filter holder 111 when the filter holder 111 is in the second attitude.

(10) In the embodiment mentioned above, the planar end face 38 contacts the connection opening 23a. However, this is not limitative. For instance, at least any of the planar end face 38 and the sloped peripheral face 39 may contact the connection opening 23a. In the embodiment mentioned above, the sloped peripheral face 39 contacts the connection opening 23b. However, this is not limitative. For instance, at least any of the planar end face 38 and the sloped peripheral face 39 may contact the connection opening 23b.

(11) The present embodiments and the modifications in the above (1) to (10) are variable appropriately by replacing or combining the element of the present embodiment or the modifications with the other element thereof.

The present invention may be embodied in other specific forms without departing from the spirit or essential attributes thereof and, accordingly, reference should be made to the appended claims, rather than to the foregoing specification, as indicating the scope of the invention.

What is claimed is:

1. A filter coupling device that allows coupling to a predetermined one of a first filter and a second filter with different shapes from each other, the filter coupling device comprising:
   connection ports that allow connection with respective connection openings of the predetermined one of the first filter and the second filter;
   a base configured to support the connection ports;
   a filter holder configured for accommodating one single filter, the single filter being the predetermined one of the first filter and the second filter;
   a rotation shaft connected with the filter holder; and
   a leg connected to the base and configured to retain the rotation shaft, wherein
   the filter holder includes:
      a first filter holder, and
      a second filter holder, and
   when the filter holder rotates around the rotation shaft, the first filter holder and the second filter holder rotate integrally,
   the filter holder takes a first attitude and a second attitude by rotating around the rotation shaft,
   the first filter holder being configured to engage and support the predetermined one of the first filter and the second filter in the first attitude; and
   the second filter holder being configured to engage and support the predetermined one of the first filter and the second filter in the second attitude.

2. The filter coupling device according to claim 1, wherein
the first filter holder is configured to contact a housing of the first filter, and the second filter holder is positioned away from the first filter, when the filter holder is in the first attitude, and
the second filter holder is configured to contact a housing of the second filter, and the first filter holder is positioned away from the second filter, when the filter holder is in the second attitude.

3. The filter coupling device according to claim 1, wherein
the first filter holder includes a floor with a placement surface,
the second filter holder includes holding arms connected with the floor,
when the filter holder is in the first attitude, the placement surface contacts a bottom of a housing of the first filter, and
when the filter holder is in the second attitude, the holding arms contact a lateral side of a housing of the second filter.

4. The filter coupling device according to claim 3, wherein
the holding arms each extend substantially perpendicularly relative to the placement surface.

5. The filter coupling device according to claim 3, wherein
the filter holder is disposed below the connection ports,
the rotation shaft has an axis extending substantially horizontally,
when the filter holder is in the first attitude, the placement surface is substantially horizontal, and the holding arms extend upwardly from the floor, and
when the filter holder is in the second attitude, the placement surface is substantially vertical, and the holding arms extend substantially horizontally from the floor.

6. The filter coupling device according to claim 3, wherein
the filter coupling device includes:
hooks connected with the holding arms; and
a first rotation restricting part connected with the leg, and
when the filter holder is in the first attitude, the first rotation restricting part is disposed in a clearance between the holding arms and the hooks while contacting the hooks.

7. The filter coupling device according to claim 6, wherein
the filter coupling device includes a second rotation restricting part connected with the leg, and
when the filter holder is in the second attitude, the second rotation restricting part is disposed in the clearance while contacting the hooks.

8. The filter coupling device according to claim 7, wherein
when the filter holder is in the second attitude, the hooks contact a lateral side of the second rotation restricting part.

9. The filter coupling device according to claim 6, wherein
the holding arms include proximal end faces connected with the floor,
the rotation shaft is connected adjacent to the proximal end faces of the holding arms, and
the hooks are connected adjacent to distal end faces of the holding arms.

10. The filter coupling device according to claim 1, wherein the leg is retained on the base so as to be movable relative to the base.

11. The filter coupling device according to claim 2, wherein the first filter holder includes a floor with a placement surface, the second filter holder includes holding arms connected with the floor, when the filter holder is in the first attitude, the placement surface contacts a bottom of the housing of the first filter, and when the filter holder is in the second attitude, the holding arms contact a lateral side of the housing of the second filter.

12. A substrate treating apparatus having:

a substrate holder configured to hold a substrate, a filter coupling device that is able to be coupled to a predetermined one of a first filter and a second filter with different shapes from each other, piping that is coupled to the filter coupling device and thereby able to be connected to both the first filter and the second filter, a nozzle connected to the piping and configured to dispense treating liquid to the substrate held by the substrate holder, wherein the filter coupling device includes:

connection ports that allow connection with respective connection openings of the predetermined one of the first filter and the second filter;

a base configured to support the connection ports;

a filter holder configured for accommodating one single filter, the single filter being the predetermined one of the first filter and the second filter;

a rotation shaft connected with the filter holder; and a leg connected to the base and configured to retain the rotation shaft, wherein the filter holder includes:

a first filter holder, and a second filter holder, and when the filter holder rotates around the rotation shaft, the first filter holder and the second filter holder rotate integrally, the filter holder takes a first attitude and a second attitude by rotating around the rotation shaft, the first filter holder being configured to engage and support the predetermined one of the first filter and the second filter in the first attitude, and the second filter holder being configured to engage and support the predetermined one of the first filter and the second filter in the second attitude.

13. The substrate treating apparatus according to claim 12, wherein the first filter holder is configured to contact a housing of the first filter, and the second filter holder is positioned away from the first filter, when the filter holder is in the first attitude, and the second filter holder is configured to contact a housing of the second filter, and the first filter holder is positioned away from the second filter, when the filter holder is in the second attitude.

14. The substrate treating apparatus according to claim 13, wherein the first filter holder includes a floor with a placement surface, the second filter holder includes holding arms connected with the floor, when the filter holder is in the first attitude, the placement surface contacts a bottom of the housing of the first filter, and when the filter holder is in the second attitude, the holding arms contact a lateral side of the housing of the second filter.

15. The substrate treating apparatus according to claim 12, wherein the first filter holder includes a floor with a placement surface, the second filter holder includes holding arms connected with the floor, when the filter holder is in the first attitude, the placement surface contacts a bottom of a housing of the first filter, and when the filter holder is in the second attitude, the holding arms contact a lateral side of a housing of the second filter.

* * * * *